United States Patent
Tomita et al.

(10) Patent No.: US 6,292,428 B1
(45) Date of Patent: Sep. 18, 2001

(54) SEMICONDUCTOR DEVICE RECONCILING DIFFERENT TIMING SIGNALS

(75) Inventors: Hiroyoshi Tomita; Tatsuya Kanda, both of Kawasaki (JP)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 09/240,007

(22) Filed: Jan. 29, 1999

(30) Foreign Application Priority Data

Feb. 3, 1998 (JP) .................................................. 10-022257

(51) Int. Cl.[7] ...................................................... G11C 8/00
(52) U.S. Cl. ................ 365/233; 365/230.08; 365/189.05
(58) Field of Search .............................. 365/233, 230.08, 365/189.05, 240

(56) References Cited

U.S. PATENT DOCUMENTS

| | | | | |
|---|---|---|---|---|
| 5,341,341 | * | 8/1994 | Fukuzo | 365/233 |
| 5,444,667 | * | 8/1995 | Obara . | |
| 5,850,368 | * | 12/1998 | Ong et al. | 365/238.5 |
| 5,892,730 | * | 4/1999 | Sato et al. | 365/189.05 X |
| 6,064,625 | | 5/2000 | Tomita . | |

FOREIGN PATENT DOCUMENTS

| | | |
|---|---|---|
| 7-141870 | 6/1995 | (JP) . |
| 10-269781 | 10/1998 | (JP) . |
| 11-16346 | 1/1999 | (JP) . |
| 12-163954 | 6/2000 | (JP) . |
| 12-40363 | 8/2000 | (JP) . |

OTHER PUBLICATIONS

Korean Intellectual Property Office Action Translation, dated Dec. 6, 2000, 2 Pages with Japanese Unexamined Patent Publication No. Hei 7–141870 (Jun. 2, 1995), 1 Page.

* cited by examiner

Primary Examiner—Huan Hoang
(74) Attorney, Agent, or Firm—Arent Fox Kintner Plotkin & Kahn, PLLC

(57) ABSTRACT

A semiconductor device which receives addresses in synchronism with a clock signal and receives data in synchronism with a strobe signal includes address-latch circuits, a first control circuit which selects one of the address-latch circuits in sequence in response to the clock signal, and controls the selected one of the address-latch circuits to latch a corresponding one of the addresses in response to the clock signal, and a second control circuit which selects one of the address-latch circuits in sequence in response to the strobe signal, and controls the selected one of the address-latch circuits to output a corresponding one of the addresses in response to the strobe signal.

42 Claims, 25 Drawing Sheets

SEMICONDUCTOR DEVICE RECONCILING DIFFERENT TIMING SIGNALS

BACKGROUND OF THE INVENTION

1. Field of the Invention

The present invention relates to semiconductor devices, and particularly relates to a semiconductor device which acquires data signals based on a data-strobe signal.

2. Description of the Related Art

According to some proposed schemes, semiconductor devices such as those functioning as memory devices may acquire address signals in synchronism with a clock signal, and input or output data signals in synchronism with a data-strobe signal different from the clock signal with an aim of achieving a stable data input/output at high speed.

FIG. 1 is a timing chart showing operations of a semiconductor device which acquires data in synchronism with a data-strobe signal. This device operations and timings thereof are conceived by the inventors for the sake of showing an example.

FIG. 1 shows a case in which data acquisition is performed based on a DDR (double data rate) scheme acquiring data in synchronism with both rising edges and falling edges of a data-strobe signal. A clock signal CLK is shown at the top, and a data-strobe signal DS is illustrated in the middle. At the bottom in the figure is demonstrated a data signal DQ which is acquired in synchronism with the data-strobe signal DS. The example of FIG. 1 demonstrates data-acquisition timings of a burst-write operation where the burst length is set to 4 to write 4-bit data D0–D3 consecutively.

At a first rising edge (clk1) of the clock signal CLK, a write command and a write address WA1 indicative of a start address are input. The write command is decoded by a command decoder, and is supplied to the write-command latch of the semiconductor device, which in turn supplies a write-enable signal. The write-enable signal activates buffers to receive the data-strobe signal DS and the data signal DQ, respectively. The data signal DQ received by one of the buffers is acquired (latched) by a latch in synchronism with the data-strobe signal DS received by the other one of the buffers. Since it takes some time to generate the write-enable signal and activate the buffers, a time period tDSS from the input of the write command (clk1) to the timing of a first rising edge of the data-strobe signal DS needs to be at least 3 ns, for example.

Data D0 is latched at the first rising edge of the data-strobe signal DS, and data D1 is latched at an immediately following falling edge. A next write address WA2 is internally generated at the second rising edge (clk2) of the clock signal CLK. Data D2 is then latched at an immediately following rising edge of the data-strobe signal DS, and data D3 is latched at a subsequent falling edge.

In the DDR scheme, the data D0 and D1 are latched by two different latches. Immediately after the data D1 is latched, the data D0 and D1 are simultaneously supplied in parallel to the internal circuit of the semiconductor device. Accordingly, data is input at half the cycles of the strobe signal, while the internal circuit operates at the same cycles as that of the strobe signal. The write address at which the data D0 and D1 are stored is WA1. Further, immediately after the latching of the data D3, the data D2 and D3 are simultaneously supplied in parallel to the internal circuit of the semiconductor device. In this case, the write address is WA2.

In the semiconductor device as described above, the data-strobe signal DS input by the user preferably has a timing thereof permitting a tolerable timing margin.

FIG. 2 is a timing chart of a data-acquisition operation in which the first rising edge of a data-strobe signal is delayed by one clock cycle behind the input of a write command.

At a first rising edge (clk1) of the clock signal CLK, a write command and a write address WA1 are input from an external source. The first rising edge of the data-strobe signal DS is delayed relative to the input of the address WA1 by one clock cycle, appearing at a timing clk2. This rising edge of the data-strobe signal DS is used to latch data D0, and a following falling edge is used to latch data D1. A next write address WA2 is internally generated at the second rising edge (clk2) of the clock signal CLK. Data D2 is then latched at a following rising edge of the data-strobe signal DS appearing at a timing clk3, and data D3 is latched at an immediately following falling edge.

Upon the latching of the data D1, the data D0 and D1 are supplied to the internal circuit of the semiconductor device in parallel. The write address for the data D0 and D1 is WA1. A write address which was internally generated by the semiconductor device at an immediately preceding timing (clk2) is, however, WA2. Because of this, a simplistic structure which stores an incoming write address in a conventional buffer results in the write address WA1 being replaced by the write address WA2 by the time when the data D0 and D1 are supplied to the internal circuit.

In order to avoid this, the write addresses WA1 and WA2 need to be successively stored in a shift register or the like, for example. In such a configuration, the write address WA1 would have to be read at a timing when the data D0 and D1 are supplied to the internal circuit, and the write address WA2 would have to be read at a timing at which the data D2 and D3 are supplied to the internal circuit.

Implementing address buffers via shift registers is effective where a clock signal and a data-strobe signal are input at such timings as shown in FIG. 2, but is not applicable to a case where these signals are input at such timings as shown in FIG. 1. Since shift registers need some time to complete shift operations thereof, the shift registers used as the address buffers may not be able to output proper addresses at a time when a write operation of data D0 and D1 starts in FIG. 1.

When the time period tDSS has such a length as shown in FIG. 1, it is required to use a write address acquired at a timing immediately prior to the supply of data to the internal circuit. That is, when the data D0 and D1 are supplied to the internal circuit, for example, the write address acquired immediately before is WA1, so that the write address WA1 needs to be provided to the internal circuit along with the data D0 and D1. In contrast, when the time period tDSS is such a period as shown in FIG. 2, the write address WA2 acquired at an immediately preceding timing should not be used, but the write address WA1 that is acquired at a timing previous to this preceding timing should be used with respect to the data D0 and D1, as described above.

If the data-strobe signal is to permit a tolerable timing margin, there is a need to attend to control of address-read operations so as to read an appropriate address from an address buffer at an appropriate timing.

Accordingly, there is a need for a semiconductor device which allows a data-strobe signal to be provided within a tolerable timing margin when acquiring data in synchronism with the data-strobe signal.

Further, a semiconductor device employing a data-strobe signal acquires data and addresses in synchronism with respective timing signals. That is, data is acquired in response to a data-strobe signal, and addresses are acquired in response to a clock signal. Because of a timing difference between a data acquisition and an address acquisition, it is difficult for an internal circuit to perform accurate data processing and data transfer at high speed by matching data with correct addresses.

Accordingly, there is a need for a semiconductor device which can process data and addresses at high speed when the data and addresses are acquired at different timings.

SUMMARY OF THE INVENTION

Accordingly, it is a general object of the present invention to provide a semiconductor device which can satisfy the need described above.

It is another and more specific object of the present invention to provide a semiconductor device which allows a data-strobe signal to be provided within a tolerable timing margin when acquiring data in synchronism with the data-strobe signal.

It is yet another object of the present invention to provide a semiconductor device which can process data and addresses at high speed when the data and addresses are acquired at different timings.

In order to achieve the above objects according to the present invention, a semiconductor device which receives addresses in synchronism with a clock signal and receives data in synchronism with a strobe signal includes address-latch circuits, a first control circuit which selects one of the address-latch circuits in sequence in response to the clock signal, and controls the selected one of the address-latch circuits to latch a corresponding one of the addresses in response to the clock signal, and a second control circuit which selects one of the address-latch circuits in sequence in response to the strobe signal, and controls the selected one of the address-latch circuits to output a corresponding one of the addresses in response to the strobe signal.

According to one aspect of the present invention, the semiconductor device as described above further includes data-latch circuits, each of which latches a corresponding datum of the data in synchronism with the strobe signal, and outputs the corresponding datum of the data in synchronism with the strobe signal.

According to another aspect of the present invention, the semiconductor device as described above is such that the data-latch circuits operate in response to a write-enable signal which is generated in response to a write command to the semiconductor device.

According to another aspect of the present invention, the semiconductor device as described above is such that said write-enable signal controls said first control circuit and said second control circuit to operate for a predetermined time period after receiving the write command.

According to another aspect of the present invention, the semiconductor device as described above is such that the first control circuit includes a first frequency divider configured to divide a frequency of the clock signal, and selects one of said address-latch circuits in sequence by using the frequency-divided clock signal from said first frequency divider, and said second control circuit includes a second frequency divider configured to divide a frequency of the strobe signal, and selects one of said address-latch circuits in sequence by using the frequency-divided strobe signal from said second frequency divider.

According to another aspect of the present invention, the semiconductor device as described above further includes an increment-latch circuit which latches one of the addresses in synchronism with the clock signal, and an address-generation circuit which increments the one of the addresses latched by said increment-latch circuit by 1, and supplies the incremented address to said address-latch circuits, wherein each of said address-latch circuits configured so as to be capable of selecting the corresponding one of the addresses externally provided or the incremented address supplied from said address-generation circuit for the latching operation thereof.

According to another aspect of the present invention, the semiconductor device as described above is such that said data-latch circuit comprises a first data-latch circuit which latches a corresponding datum of the data in synchronism with a rising edge of the strobe signal, and a second data-latch circuit which latches a corresponding datum of the data in synchronism with a falling edge of the strobe signal.

In the semiconductor device which receives the addresses in synchronism with the clock signal and receives data in synchronism with the strobe signal, the address-latch circuits latch the addresses in response to the clock signal, and outputs the addresses in synchronism with the strobe signal. During this operation, the addresses are written one after another into a successively selected one of the address-latch circuits, and are read therefrom successively. This makes it possible to simultaneously supply the data and the corresponding addresses to the internal circuit in synchronism with the strobe signal. An appropriate data-write operation is thus achieved regardless of the timing of the data-strobe signal as long as this timing falls within a tolerable margin.

According to another aspect of the present invention, a semiconductor device which receives addresses in synchronism with a clock signal and receives data in synchronism with a strobe signal includes data-latch circuits, a first control circuit which selects one of said data-latch circuits in sequence in response to the strobe signal, and controls the selected one of said data-latch circuits to latch a corresponding datum of the data in response to the strobe signal, and a second control circuit which selects one of said data-latch circuits in sequence in response to the clock signal, and controls the selected one of said data-latch circuits to output a corresponding datum of the data in response to the clock signal.

According to another aspect of the present invention, the semiconductor device as described above further includes an address-latch circuit which latches the addresses in sequence in synchronism with the clock signal, and outputs the addresses in synchronism with the clock signal.

According to another aspect of the present invention, the semiconductor device as described above is such that the data-latch circuits operate in response to a write-enable signal which is generated in response to a write command to the semiconductor device.

According to another aspect of the present invention, the semiconductor device as described above is such that the write-enable signal controls said first control circuit and said second control circuit to operate for a predetermined time period after receiving the write command.

According to another aspect of the present invention, the semiconductor device as described above is such that said first control circuit includes a first frequency divider configured to divide a frequency of the strobe signal, and selects one of said data-latch circuits in sequence by using the frequency-divided strobe signal from said first frequency divider, and said second control circuit includes a second frequency divider configured to divide a frequency of the clock signal, and selects one of said data-latch circuits in sequence by using the frequency-divided clock signal from said second frequency divider.

According to another aspect of the present invention, the semiconductor device as described above further includes an address-generation circuit which increments one of the addresses latched by said address-latch circuit, and supplies the incremented address to said address-latch circuit, wherein said address-latch circuit is configured so as to be capable of selecting the addresses externally provided or the incremented address supplied from said address-generation circuit for the latching operation thereof.

According to another aspect of the present invention, the semiconductor device as described above is such that each of said data-latch circuits includes a first latch which latches a corresponding datum of the data in synchronism with a rising edge of the strobe signal, and a second latch which latches a corresponding datum of the data in synchronism with a falling edge of the strobe signal.

According to another aspect of the present invention, the semiconductor device as described above is such that said address-latch circuit includes a delay circuit which delays output timings of the addresses by a predetermined number of cycles of the clock signal.

According to another aspect of the present invention, the semiconductor device as described above further includes an address buffer, wherein said address-latch circuit(s) supplies the addresses to said address buffer without a clock-cycle delay during a read operation.

In the semiconductor device which receives the addresses in synchronism with the clock signal and receives data in synchronism with the strobe signal, the data-latch circuits latch the data in response to the strobe signal, and outputs the data in synchronism with the clock signal. During this operation, the data are written one datum after another into a successively selected one of the data-latch circuits, and are read therefrom successively. This makes it possible to simultaneously supply the data and the corresponding addresses to the internal circuit in synchronism with the clock signal. An appropriate data-write operation is thus achieved regardless of the timing of the data-strobe signal as long as this timing falls within a tolerable margin.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 3:
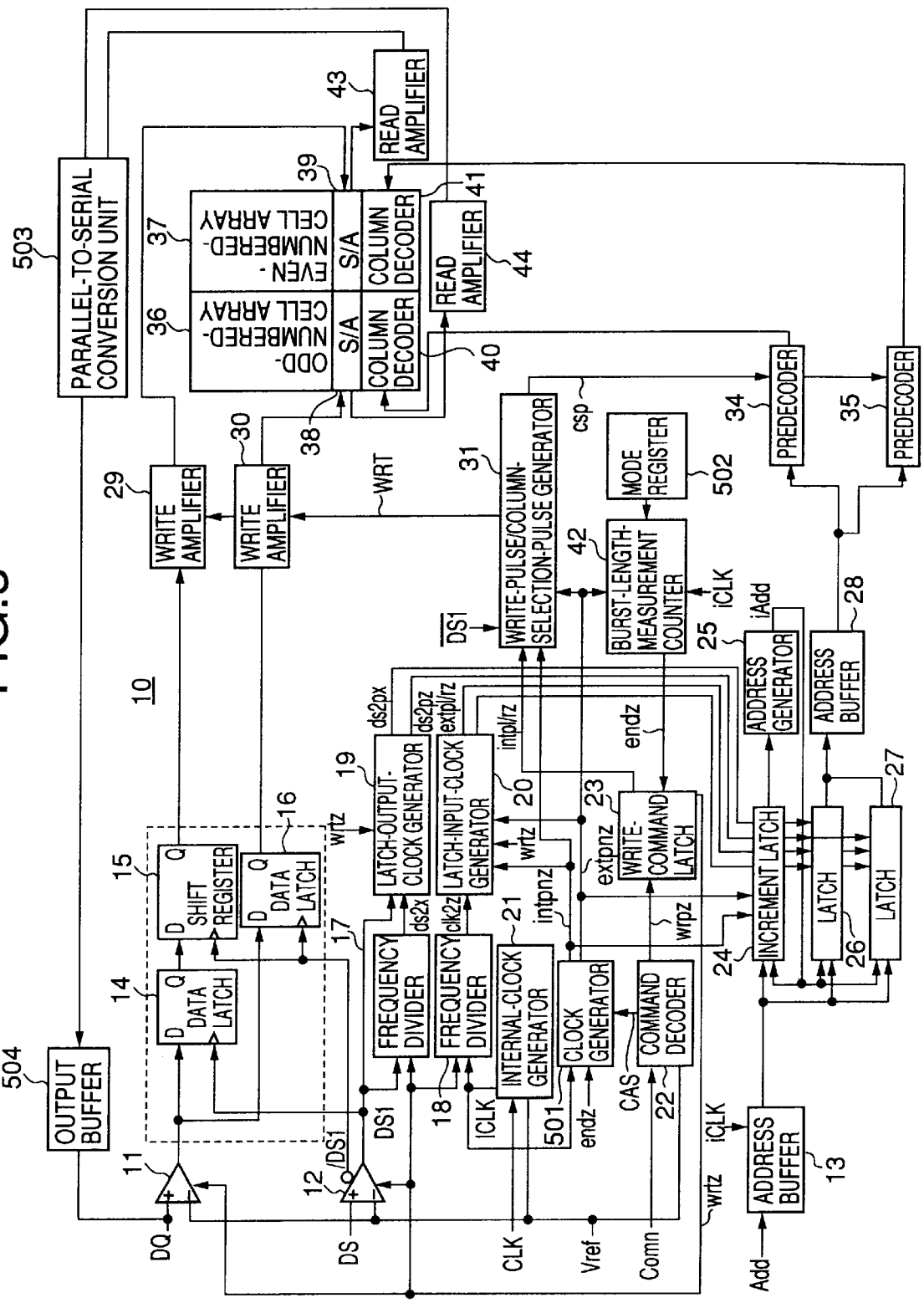
FIG. 3 is a block diagram showing a first embodiment of a semiconductor memory device according to the present invention.

FIG. 3 is a block diagram showing a first embodiment of a semiconductor memory device according to the present invention. In particular, the figure shows a schematic diagram of a DDR-type synchronous DRAM.

A semiconductor memory device 10 includes a data-input buffer 11, a data-strobe-input buffer 12, an address buffer 13, a data latch 14, a shift register 15, a data latch 16, a frequency divider 17, a frequency divider 18, a latch-output-clock generator 19, a latch-input-clock generator 20, an internal-clock generator 21, a command decoder 22, a write-command latch 23, an increment latch 24, an address generator 25, a latch 26, a latch 27, an address buffer 28, a write amplifier 29, a write amplifier 30, a write-pulse/column-selection-pulse generator 31, a predecoder 34, a predecoder 35, an odd-numbered-cell array 36, an evennumbered-cell array 37, a sense amplifier 38, a sense amplifier 39, a column decoder 40, a column decoder 41, a burst-length-measurement counter 42, a read amplifier 43, a read amplifier 44, a clock generator 501, a mode register 502, a parallel-to-serial conversion unit 503, and an output buffer 504.

The semiconductor memory device 10 inputs an address in synchronism with a clock signal CLK, and acquires a data signal DQ in synchronism with a data-strobe signal DS. In practice, each of data and an address are comprised of a plurality of bits. In the following description, however, a circuit structure will be shown with respect to only one of these bits for the sake of clarity of explanation.

In the semiconductor memory device 10 according to the first embodiment of the present invention, the latches 26 and 27 connected in parallel latch two consecutive addresses input thereto. The latches 26 and 27 latch the input addresses in synchronism with the clock signal CLK under the control of the latch-input-clock generator 20 when these input addresses are supplied from the address buffer 13, which receives the addresses in synchronism with an internal clock signal iCLK. Alternatively, the latches 26 and 27 latch internal addresses iAdd generated by the increment latch 24 and the address generator 25. Further, the latches 26 and 27 supply the latched addresses to the address buffer 28 in synchronism with the data-strobe signal DS under the control of the latch-output-clock generator 19. The input addresses have a first one thereof latched by the latch 26, and are latched thereafter by the latch 27 and the latch 26 in turn. When the latched addresses are supplied to the address buffer 28, a first one is supplied form the latch 26, and the subsequent data are supplied from the latch 27 and the latch 26 in turn.

Figure 1:
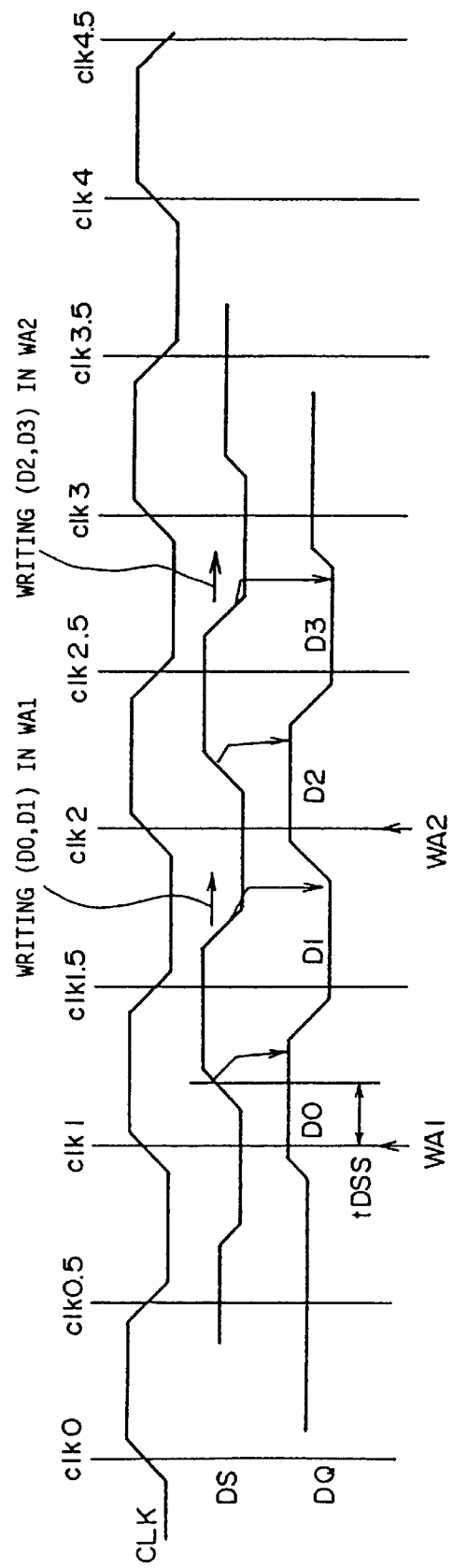
FIG. 1 is a timing chart showing operations of a semiconductor device which acquires data in synchronism with a data-strobe signal.
Figure 2:
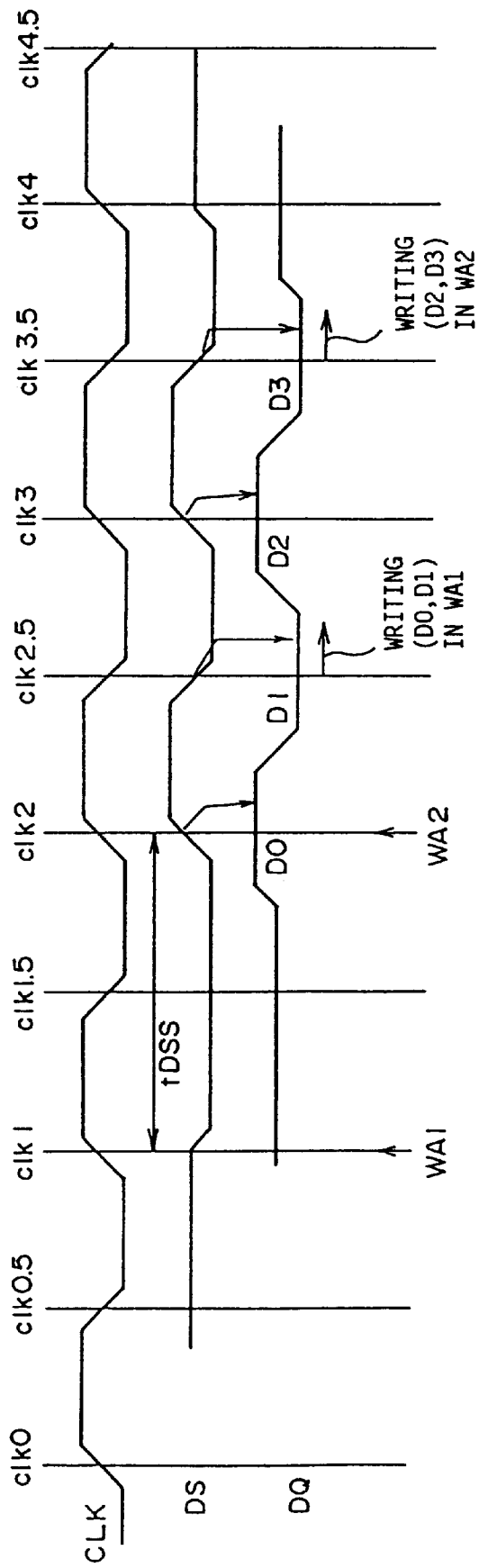
FIG. 2 is a timing chart of a data-acquisition operation in which a first rising edge of a data-strobe signal is delayed by one clock cycle behind inputting of a write command.

A configuration as described above can cope with the case in which the time period tDSS is the shortest as shown in FIG. 1 as well as the case in which the time period tDSS is the longest as shown in FIG. 2.

In the case of the shortest tDSS as shown in FIG. 1, the latch 26 latches the address WA1 in synchronism with the clock signal, and outputs the address WA1 at an edge of the data-strobe signal corresponding to the timing at which the data D1 is supplied. Then, the latch 27 latches the address WA2, and the address WA2 is output at an edge of the data-strobe signal corresponding to a timing of the data D3.

In the case of the longest tDSS as shown in FIG. 2, the address WA1 is latched by the latch 26, and, then, the address WA2 is latched by the latch 27. At an edge of the data-strobe signal corresponding to a timing of the data D1, the address WA1 is output from the latch 26. Then, the address WA2 is output from the latch 27 at an edge of the data-strobe signal corresponding to a timing of the data D3.

Further, the latches 26 and 27 output addresses to the address buffer 28 in synchronism with the data-strobe signal. Likewise, in synchronism with the data-strobe signal, the shift register 15 and the data latch 16 output data in parallel to the write amplifiers 29 and 30. Because of this, the internal circuit operating in synchronism with the data-strobe signal can process data signals and address signals at high speed with sufficient accuracy. Here, the internal circuit refers to a set of circuits provided at stages subsequent to the address buffer 28, the shift register 15, and data latch 16, and includes the predecoders 34, 35, the write amplifiers 29, 30, the sense amplifiers 38, 39, the column decoders 40, 41, etc.

In the first embodiment of the present invention described above, the input addresses are stored in the two latches 26 and 27 which are provided in parallel. The addresses stored in the latches 26 and 27 are then subsequently read at appropriate timings, thereby coping with any timings of the data-strobe signal DS supplied within a tolerable timing margin ranging from the shortest tDSS to the longest tDSS.

In what follows, operations of the semiconductor memory device 10 will be described.

The command decoder 22 receives a command Comm (i.e., a combination of control signals such as /RAS, /CAS, /CS, /WE, and the like) in synchronism with the clock signal CLK, and decodes the same to generate a write signal wrpz and a CAS signal when the command is a write command. These signals are comprised of HIGH pulses. The CAS signal is also generated in response to other commands such as a read command. When the CAS signal is supplied to the clock generator 501, an external-timing-pulse signal extpnz is generated as a one-shot HIGH pulse. After this, the clock generator outputs HIGH pulses as an internal-timing-pulse signal intpnz in synchronism with the internal clock signal iCLK until the burst-length-measurement counter outputs a burst-end signal endz (L level). The burst-length-measurement counter 42 measures the burst length. The burst-length-measurement counter 42 is reset by the external-timing-pulse signal extpnz, and, then, counts the internal-timing-pulse signal intpnz as many times as the burst length, which is stored in the mode register 502 in advance. When the counting is completed, the burst-end signal endz is output to the write-command latch 23 in response to the internal clock signal iCLK. The write-command latch 23 outputs a write-enable signal wrtz that is at a HIGH level in response to the write signal wrpz sent from the command decoder 22, and resets the write-enable signal wrtz when receiving an endpz signal (L level) from the burst-length-measurement counter 42.

The internal-timing-pulse signal intpnz and the external-timing-pulse signal extpnz are supplied to the latch-input-clock generator 20 to control generation of latch-input clocks. External-latch-input clocks extplz and extprz are used for controlling acquisition of external addresses by the latches 26 and 27, and internal-latch-input clocks intplz and intprz are used for controlling acquisition of internal addresses by the latches 26 and 27.

The write-enable signal wrtz is supplied to the data-input buffer 11 and the data-strobe-input buffer 12 so as to enable these buffers. The write-enable signal wrtz is also supplied to the frequency divider 17 and the frequency divider 18, thereby prompting a start of frequency-division operations of the frequency dividers 17 and 18.

The write-enable signal wrtz is output from the write-command latch 23 only for a predetermined duration following the input of the write command. this makes it possible to make the frequency dividers 17 and 18 operate only with respect to a predetermined number of cycles.

The data-input buffer 11 receives the data signal DQ when being enabled by the write-enable signal wrtz. The data-strobe-input buffer 12 enabled by the write-enable signal wrtz receives the data-strobe signal DS, and outputs a DS1 signal having a rising edge synchronized with a rising edge of the DS signal and a /DS1 signal rising in synchronism with a falling edge of the DS signal. The DS1 signal is supplied to the data latch 14, the frequency divider 17, and the latch-output-clock generator 19, and the /DS1 signal is supplied to the shift register 15 and the data latch 16.

The data signal DQ received by the data-input buffer 11 is stored in the data latch 14 in synchronism with the DS1 signal. A next one of the data signal DQ is stored in the data latch 16 in synchronism with the /DS1 signal. The data signal DQ stored in the data latch 14 is further stored in the shift register 15 in synchronism with the data-strobe signal /DS1. When data D0 and D1 are successively supplied, therefore, the shift register 15 stores the data D0, and the data latch 16 stores the data D1. Then, the shift register 15 and the data latch 16 output the data D0 and D1 in parallel to the write amplifiers 29 and 30, respectively, in synchronism with the /DS1 signal. The data latches 14 and 16 and the shift register 15 together form a serial-to-parallel conversion unit 505.

The data stored in the shift register 15 and the data latch 16 are provided to the internal circuit, and, in detail, are supplied to the sense amplifiers 38 and 39 via the write amplifiers 29 and 30, respectively. Operation timings of the write amplifiers 29 and 30 are controlled by the write-amplifier-activation signal WRT supplied from the write-pulse/column-selection-pulse generator 31. Column addresses for selecting sense amplifiers to store data therein when the data is supplied to the sense amplifiers 38 and 39 are supplied from the predecoders 34 and 35 to the column decoders 40 and 41, respectively, where the column addresses are decoded. The data stored in the sense amplifiers 38 and 39 are then supplied and stored in the odd-numbered-cell array 36 and the even-numbered-cell array 37, respectively. The odd-numbered-cell array 36 and the even-numbered-cell array 37 are comprised of DRAM-memory-cell arrays, for example. Each cell array includes a plurality of memory cells arranged in a matrix and comprised of memory-cell capacitors and access transistors, a plurality of word-lines arranged in a row direction for the purpose of selecting the access transistors, and a plurality of bit lines arranged in a column direction for the purpose of conveying data from the memory cell via the access transistors to the sense amplifiers and writing the data of the sense-amplifiers into the memory cells.

Further, the odd-numbered-cell array and the even-numbered cell array respectively correspond to odd addresses and even addresses. When the address WA1 of FIG. 1 is an odd address, for example, the data D0 is written into memory cells selected from the odd-numbered-cell array, and the data D1 is written into memory cells selected from the even-numbered-cell array.

During a read operation, on the other hand, data of selected memory cells in the odd-numbered-cell array 36 and the even-numbered-cell array 37 are supplied to and amplified by the sense amplifiers 38 and 39, respectively. Then, data is output from the sense amplifiers selected by the column decoders 40 and 41, and is supplied in parallel to the read amplifiers 43 and 44, respectively. The data of the read amplifiers 43 and 44 are converted into serial data by the parallel-to-serial conversion unit 503. The serial data is then output to outside from the data pins DQ via the output buffer 504.

The clock signal CLK is supplied to the internal-clock generator 21. The internal-clock generator 21 in turn generates the internal clock signal iCLK which is synchronized with the external clock signal CLK.

The frequency divider 17 divides a frequency of the data-strobe signal DS1 in response to the write-enable signal wrtz, and generates a frequency-divided-data-strobe signal ds2x. Similarly, the frequency divider 18, upon receiving the write-enable signal wrtz, divides a frequency of the internal clock signal iCLK to generate a frequency-divided-clock signal clk2z.

The latch-output-clock generator 19 generates latch-output clocks ds2px and ds2pz based on the data-strobe signal DS1 and the frequency-divided-data-strobe signal ds2x. The latch-output clocks ds2px and ds2pz are pulse signals, and become HIGH in turn at falling edges of the data-strobe signal DS. That is, each of them becomes HIGH at every other falling edge of the data-strobe signal DS.

The latch-output clock ds2px controls timings of address output of the latch 26, and the latch-output clock ds2pz controls timings of address output of the latch 27. In this manner, addresses are output from the latch 26 and the latch 27 in turn.

The latch-input-clock generator 20 receives the external-timing-pulse signal extpnz, which is the one-short-pulse signal supplied from the clock generator 501 in response to a command input, and outputs the same as either the external-latch-input clock extplz or the external-latch-input clock extprz according to whether the frequency-divided-clock signal clk2z is HIGH or LOW. In a burst-write operation, the latch-input-clock generator 20 receives the internal-timing-pulse signal intpnz from the clock generator 501 after receiving the external-timing-pulse signal extpnz. Then, the latch-input-clock generator 20 outputs the internal-timing-pulse signal intpnz as either the internal-latch-input clock intplz or the internal-latch-input clock intprz according to whether the frequency-divided-clock signal clk2z is HIGH or LOW.

The latch 26 latches an address signal Add supplied from the address buffer 13 when the external-latch-input clock extprz is HIGH. Also, the latch 26 latches an internal address signal iAdd supplied from the address generator 25 when the internal-latch-input clock intprz is HIGH. Then, the latched address signal is supplied to the address buffer 28 when the latch-output clock ds2px is HIGH.

The latch 27 latches an address signal Add supplied from the address buffer 13 when the external-latch-input clock extplz is HIGH. Also, the latch 27 latches an internal address signal iAdd supplied from the address generator 25 when the internal-latch-input clock intplz is HIGH. Then, the latched address signal is supplied to the address buffer 28 when the latch-output clock ds2pz is HIGH.

The address signal is supplied from the address buffer 28 to the predecoders 34 and 35. Based on a timing of a column-selection pulse csp supplied from the write-pulse/column-selection-pulse generator 31, the predecoders 34 and 35 attends to predecoding processing. Decoded address signals obtained as a result of predecoding are supplied to the column decoders 40 and 41. The column decoders 40 and 41 indicate data-write addresses by further decoding the results of predecoding.

The increment latch 24 and the address generator 25 are provided for the purpose of automatically generating internal addresses during a burst operation. In a burst operation, the increment latch 24 latches external addresses supplied from the address buffer 13 in synchronism with the external-timing-pulse signal extpnz supplied from the clock generator 501. The address generator 25 adds 1 to the address output from the increment latch 24 to generate an internal address iAdd, and sends the internal address iAdd to the increment latch 24 and the latches 26 and 27. The increment latch 24 latches the internal address in response to the internal-timing-pulse signal intpnz from the clock generator 501. After this, acquisition of an internal address by the increment latch 24 and an address increment by the address generator 25 are repeated as many times as the burst length minus 1. Here, the burst length is specified in the mode register 502.

The write-pulse/column-selection-pulse generator 31 receives the data-strobe signal DS1 and the internal clock signal iCLK, and outputs the write-amplifier-activation signal WRT and the column-selection signal csp in accordance with an operation mode specified by the write-enable signal wrtz. Namely, when a write operation is specified (wrtz=H), the write-pulse/column-selection-pulse generator 31 outputs the write-amplifier-activation signal WRT and the column-selection signal csp at a predetermined timing in response to the data-strobe signal DS1. When a read operation is specified (wrtz=L), the write-pulse/column-selection-pulse generator 31 generates the column-selection signal csp in response to the internal-timing-pulse signal intpnz and the external-timing-pulse signal extpnz, and puts the write-amplifier-activation signal WRT in an deactivated state (i.e., fixed at a L level) so as to stop operations of the write amplifiers 29 and 30.

FIGS. 4A through 4I are timing charts showing input/output timings of the latches 26 and 27.

These figures show the clock signal CLK, the frequency-divided-clock signal clk2z, the external-timing-pulse signal extpnz, the external-latch-input clock extprz, the external-latch-input clock extplz, the data-strobe signal DS, the frequency-divided-data-strobe signal ds2x, the latch-output clock ds2px, and the latch-output clock ds2pz in this order from the top to the bottom. FIGS. 4A through 4I show a case in which the burst length is 4, and an address is input along with a write command at each rising edge of the clock signal CLK. As previously described, the latch 26 acquires the first external address signal based on the external-latch-input clock extprz, and outputs the same based on the latch-output clock ds2px. In the case of the latch 27, the next external address signal is acquired based on the external-latch-input clock extplz, and the same is output based on the latch-output clock ds2pz.

As is apparent from the figures, the address acquired by the latch 26 in response to the external-latch-input clock extprz is supplied to the address buffer 28 always earlier than the other address that is acquired one clock later by the latch 27 in response to the external-latch-input clock extplz. Also, two addresses (A1, A2) latched at successive rising edges of the clock CLK are stored in the separate latches 26 and 27, respectively, so that the first address (A1) is retained even when the second address is input. Further, a data-output timing of parallel data output from the shift register 15 and the data latch 16 and an address-output timing of addresses output from the latches 26 and 27 are based on the data-strobe signal. Because of this, the internal circuit can match data with a corresponding address by using the data-strobe signal as a reference. In FIGS. 2A through 2I, the address A1 latched by the latch 26 in response to the first rising edge of the clock signal CLK is output to the address buffer 28 at a falling edge of the data-strobe signal indicated by t=1. Matching the address A1, the data D0 and D1 respectively latched by the shift register 15 and the data latch 16 are also output to the write amplifiers 29 and 30 at the falling edge of the data-strobe signal at the time t=1. Namely, although different timing signals (i.e., the clock signal and the data-strobe signal) are used for establishing synchronizations when the semiconductor device acquires an address and data, the internal circuit can process the address and data in synchronism with the common timing signal (i.e., data-strobe signal in this example).

According to the first embodiment of the present invention as described above, the two latches 26 and 27 provided in parallel, rather than a shift register, store the input addresses, and output the same at respective appropriate timings. In this manner, the data-strobe signal DS can be provided at any timing within the timing margin between the shortest tDSS and the longest tDSS while an appropriate operation is insured.

In what follows, a description will be provided with regard to a configuration of each element which is relevant to latch-input/output timings of address signals according to the present invention.

Figure 5:
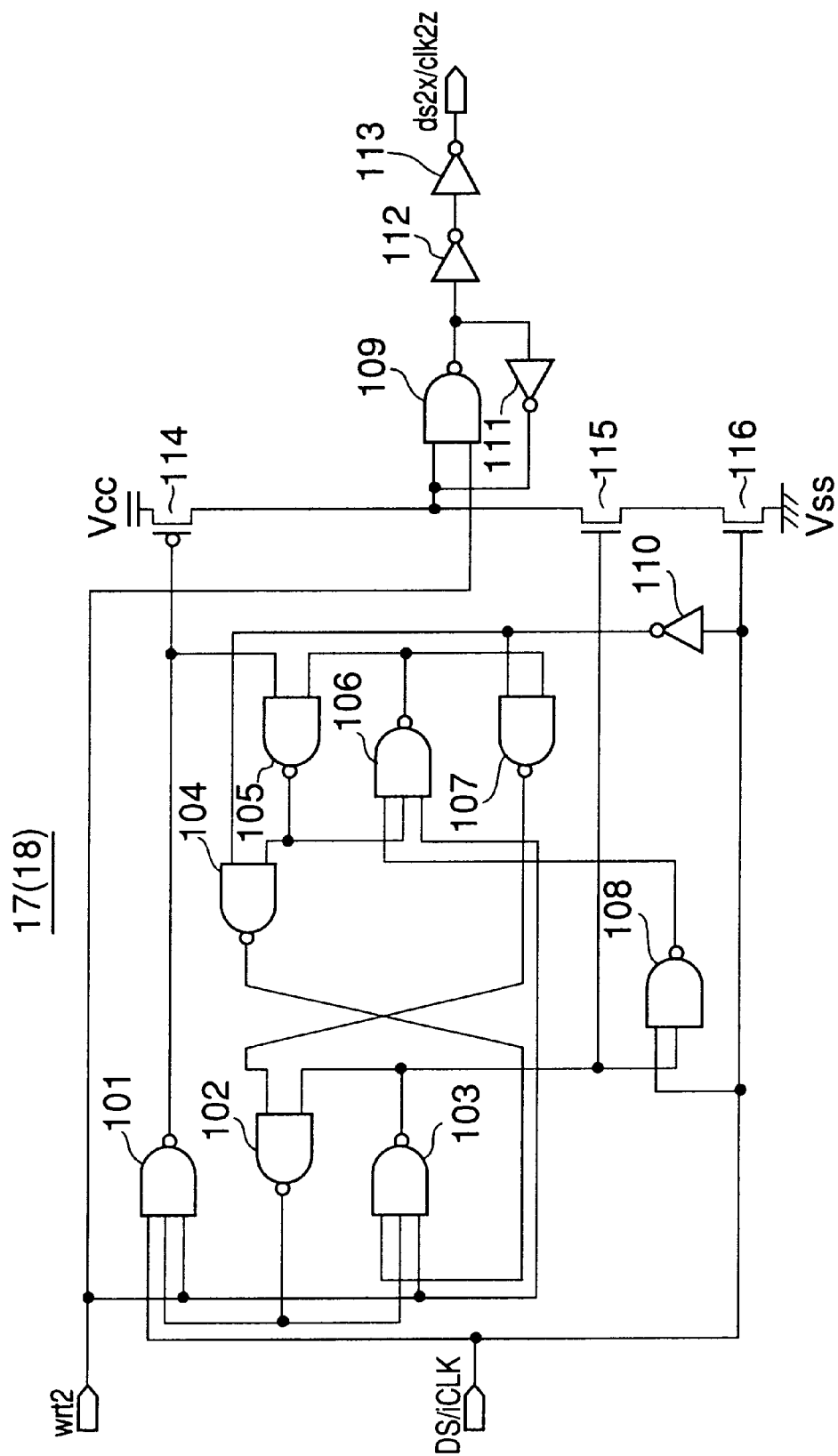
FIG. 5 is a circuit diagram showing a circuit configuration of frequency divider.

FIG. 5 is a circuit diagram showing a circuit configuration of the frequency divider 17 or 18.

The frequency divider 17 or 18 of FIG. 5 includes NAND circuits 101 through 109, inverters 110 through 113, a PMOS transistor 114, and NMOS transistors 115 and 116. The write-enable signal wrtz is supplied to the NAND circuits 101, 103, 106, and 109. This makes sure that the frequency divider of FIG. 5 operates only when the write-enable signal wrtz is HIGH. When the data-strobe signal DS1 or the internal clock signal iCLK is input while the write-enable signal wrtz is HIGH, a frequency-divided output signal changes to a HIGH level in response to the first rising edge of the input signal, and, then, the input signal is subjected to ½-frequency division to be output as the frequency-divided-data-strobe signal ds2x or the frequency-divided-clock signal clk2z, respectively. When the write-enable signal wrtz is LOW, the output of the frequency divider is fixed to HIGH. Frequency-division operations per se are well within the scope of ordinary skill in the art, and a description thereof will be omitted.

Figure 6:
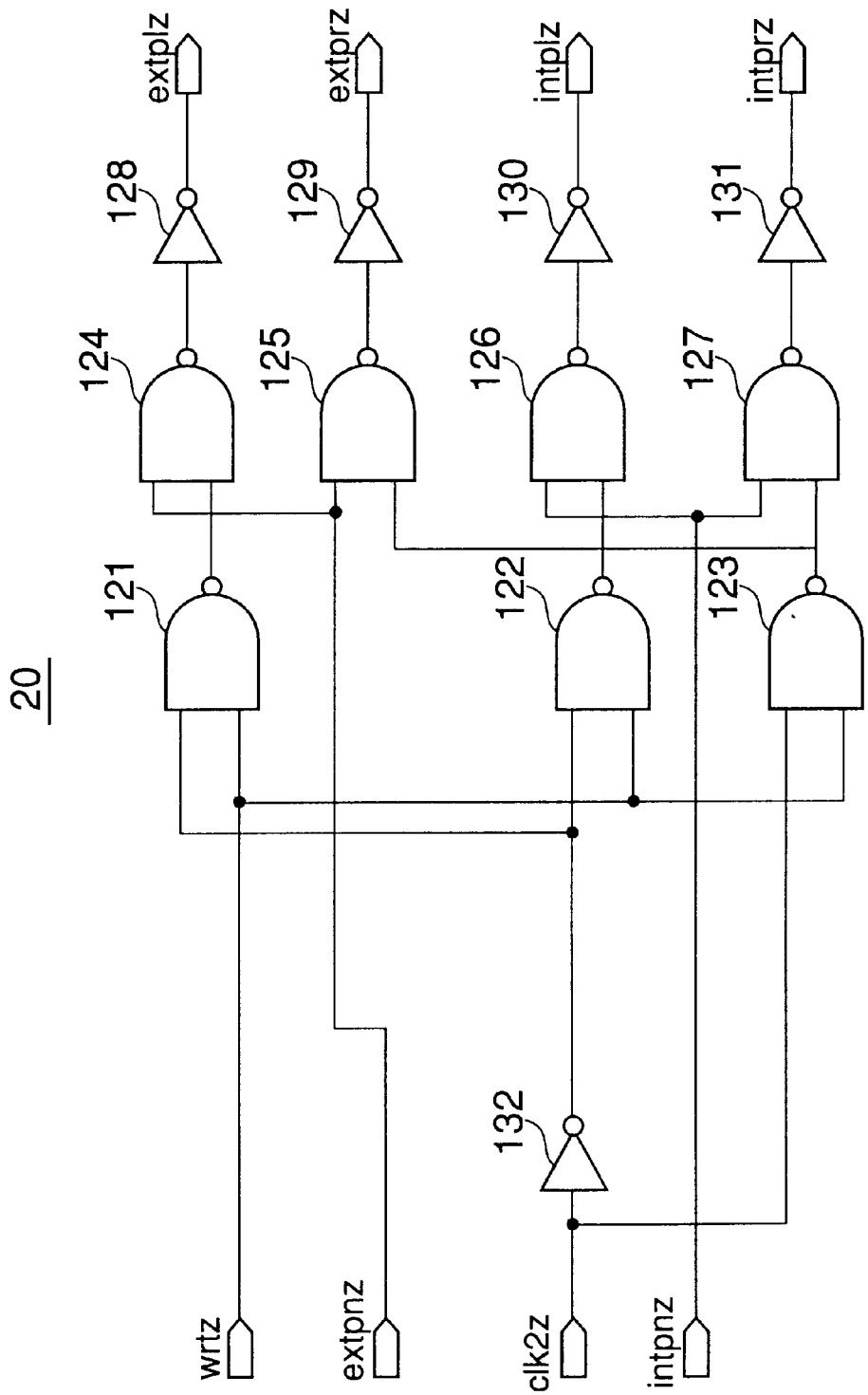
FIG. 6 is a circuit diagram showing a circuit configuration of a latch-input-clock generator.

FIG. 6 is a circuit diagram showing a circuit configuration of the latch-input-clock generator 20.

The latch-input-clock generator 20 of FIG. 6 includes NAND circuits 121 through 127 and inverters 128 through 132. When the write-enable signal wrtz is HIGH, a signal having the same phase as the frequency-divided-clock signal clk2z is supplied via the inverter 132 and the NAND circuit 121 to one input of the NAND circuit 124. The other input of the NAND circuit 124 receives the external-timing-pulse signal extpnz. During periods when the frequency-divided-clock signal clk2z is HIGH, the external-timing-pulse signal extpnz is output as the external-latch-input clock extplz. Further, an inverse of the frequency-divided-clock signal clk2z is supplied via the NAND circuit 123 to one input of the NAND circuit 125. The other input of the NAND circuit 125 receives the external-timing-pulse signal extpnz. During periods when the frequency-divided-clock signal clk2z is LOW, therefore, the external-timing-pulse signal extpnz is output as the external-latch-input clock extprz. In an example of FIGS. 4A through 4I, the external-timing-pulse signal extpnz is output in synchronism with rising edges of the clock pulse CLK, and the frequency-divided-clock signal clk1z starts from an L level and changes between H and L at each rising edge of the clock. In the example of FIGS. 4A through 4I in a write operation, therefore, the latch-input-clock generator first supplies an extprz-signal pulse to the latch 26, and, then, supplies an extplz-signal pulse to the latch 27. In this manner, the external addresses are latched first by the latch 26 and next by the latch 27. When the write-enable signal wrtz is LOW, the external-timing-pulse signal extpnz is output as the external-latch-input clocks extplz and extprz at all times.

In the case of a burst-write operation, the internal-timing-pulse signal intpnz is supplied as many times as the burst length after the external-timing-pulse signal extpnz is first supplied in synchronism with a rising edge of the clock at which the write command is input.

When the internal-timing-pulse signal intpnz is supplied, the internal-timing-pulse signal intpnz is output as the latch-input clock intplz during time periods when the frequency-divided-clock signal clk2z is HIGH. During time periods when the frequency-divided-clock signal clk2z is LOW, on the other hand, the internal-timing-pulse signal intpnz is output as the latch-input clock intprz. In the case of a burst-write operation, the external-timing-pulse signal extpnz is supplied during a period when the frequency-divided-clock signal clk2z is LOW, so that the latch-input-clock generator 20 outputs the external-latch-input clock extprz. In response, the latch 26 latches an external address Add. After the frequency-divided clock changes to HIGH, the internal-timing-pulse signal intpnz is supplied, so that the latch-input-clock generator 20 outputs the internal-latch-input clock intplz. In response, the latch 27 latches an internal address iAdd generated by the address generator 25. Where the write-enable signal wrtz is LOW, the latch-input clocks intplz and intprz become identical to the internal-timing-pulse signal intpnz.

Figure 7:
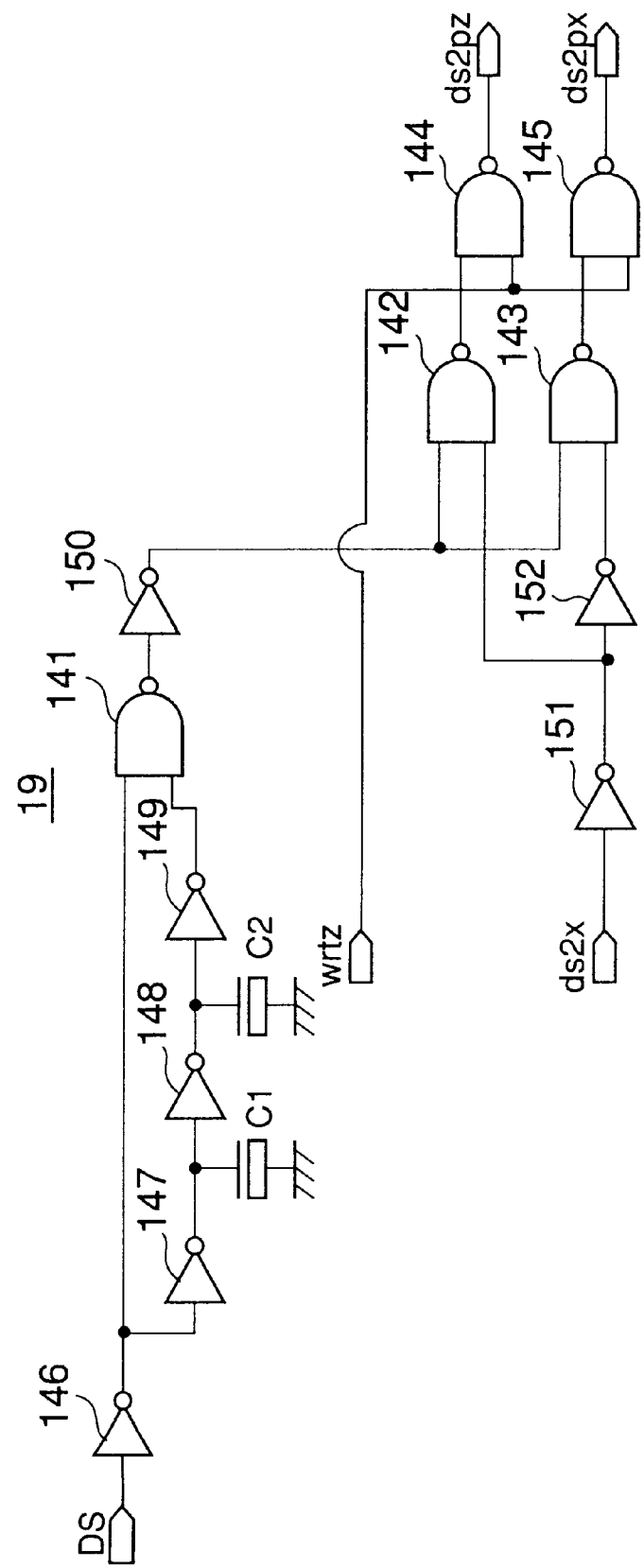
FIG. 7 is a circuit diagram showing a circuit structure of a latch-output-clock generator.

FIG. 7 is a circuit diagram showing a circuit structure of the latch-output-clock generator 19.

The latch-output-clock generator 19 of FIG. 7 includes NAND circuits 141 through 145, inverters 146 through 152, and capacitors C1 and C2. The data-strobe signal DS1 input to the inverter 146 is delayed by a series of delay elements comprised of the inverters 147 through 149 and the capacitors C1 and C2. The NAND circuit 141 and the inverter 150 perform an AND operation between an inverse of the data-strobe signal DS1 and the delayed data-strobe signal, thereby generating a pulse signal becoming HIGH at falling edges of the data-strobe signal DS1. This pulse signal is output as the latch-output clock ds2px via the NAND circuits 143 and 145 when the frequency-divided-data-strobe signal ds2x is HIGH. When the frequency-divided-data-strobe signal ds2x is LOW, on the other hand, the pulse signal is output as the latch-output clock ds2pz via the NAND circuits 142 and 144. Where the write-enable signal wrtz is LOW, both the latch-output clock ds2pz and ds2px are fixed to HIGH.

In the example of FIGS. 2A through 2I, the frequency-divided-data-strobe signal ds2x becomes HIGH in response to a first rising edge of the data-strobe signal DS, so that the latch-output-clock generator 19 first outputs the latch-output clock ds2px. In response, the latch 26 supplies the address latched therein to the address buffer 28. Then, the latch-output-clock generator 19 outputs the latch-output clock ds2pz, which prompts the latch 27 to supply the latched address to the address buffer 28.

Figure 8:
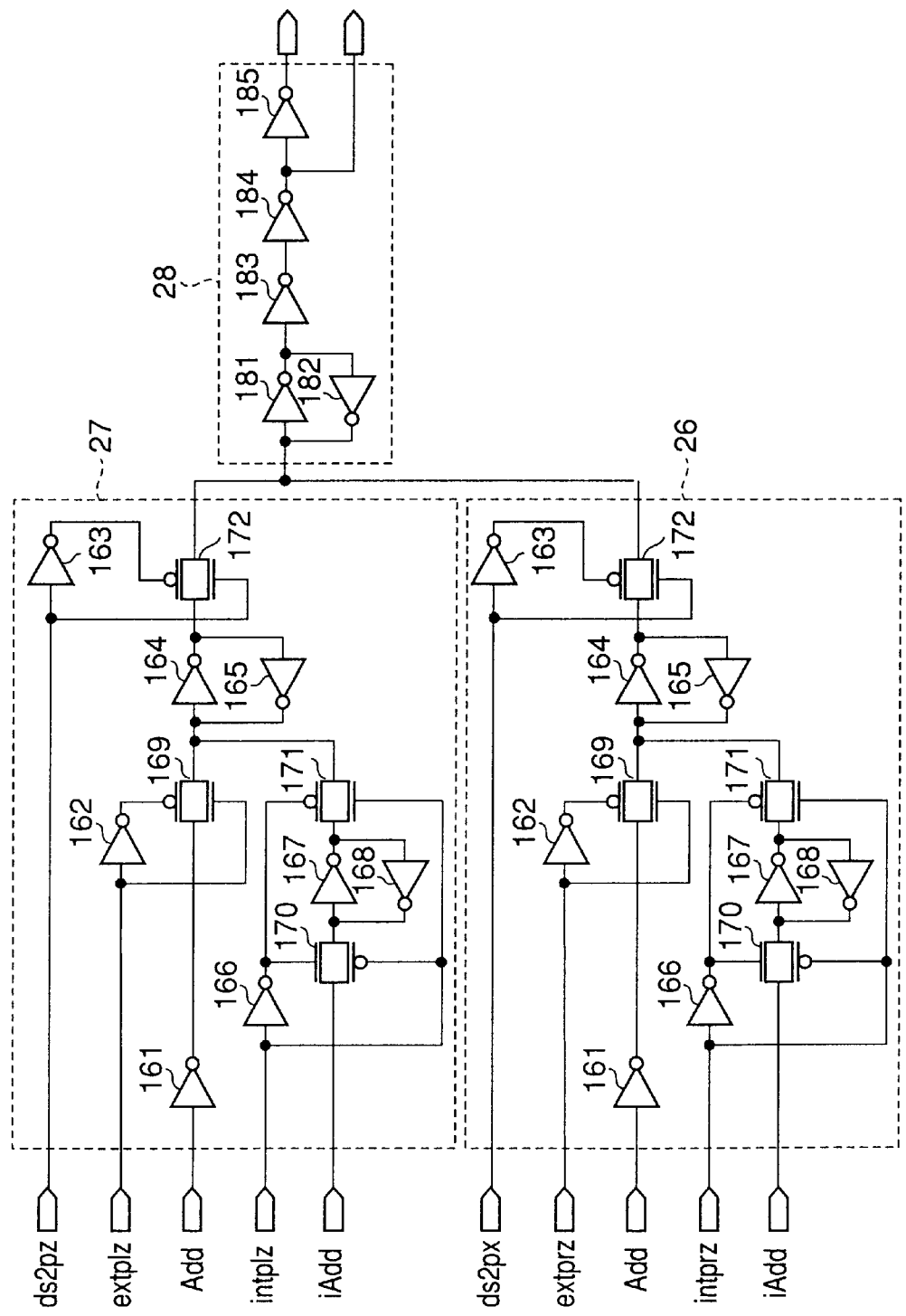
FIG. 8 is a circuit diagram showing a circuit structure of the latches and an address buffer.

FIG. 8 is a circuit diagram showing a circuit structure of the latches 26 and 27 as well as the address buffer 28.

The latches 26 and 27 in FIG. 8 have the same configuration, and include inverters 161 through 168 and transfer gates 169 through 172. Each of the transfer gates 169 through 172 is comprised of a PMOS transistor and an NMOS transistor. When the external-latch-input clock extplz (or extprz) becomes HIGH, the transfer gate 169 is opened, so that the external address signal Add from the address buffer 13 (FIG. 3) is latched by a latch comprised of the inverters 164 and 165. The address signal stored in the latch is supplied to the address buffer 28 when the latch-output clock ds2pz (or ds2px) becomes HIGH so as to open the transfer gate 172.

Where the internal-latch-input clock intplz (or intprz) is supplied, an incremented internal address signal iAdd supplied from the address generator 25 (FIG. 3) is latched by a latch comprised of the inverters 167 and 168. The incremented address signal iAdd is then stored in the latch made up from the inverters 164 and 165 at a timing when the latch-input clock intplz (or intprz) becomes HIGH. The address signal stored in the latch is supplied to the address buffer 28 via a transfer gate 172 when the gate is opened during a HIGH period of the latch-output clock ds2pz (or ds2px).

The address buffer 28 includes inverters 181 through 185. The address buffer 28 stores the address signal supplied serially from either the latch 26 or the latch 27, and outputs the address signal and an inverse thereof.

When the write-enable signal wrtz is LOW (i.e., in a read operation), the latch-input clocks extplz and extprz prompt the latching of the address signal Add, or the latch-input clocks intplz and intprz trigger the latching of the address signal iAdd. As previously described in connection with FIG. 7, the address signal latched in the latch 26 or 27 is immediately supplied to the address buffer during a read operation since the latch-output clocks ds2pz and ds2px are HIGH. In this manner, the configuration described above insures that only a minimum time period is necessary before supplying an address output subsequent to the input of a read command.

Figure 9:
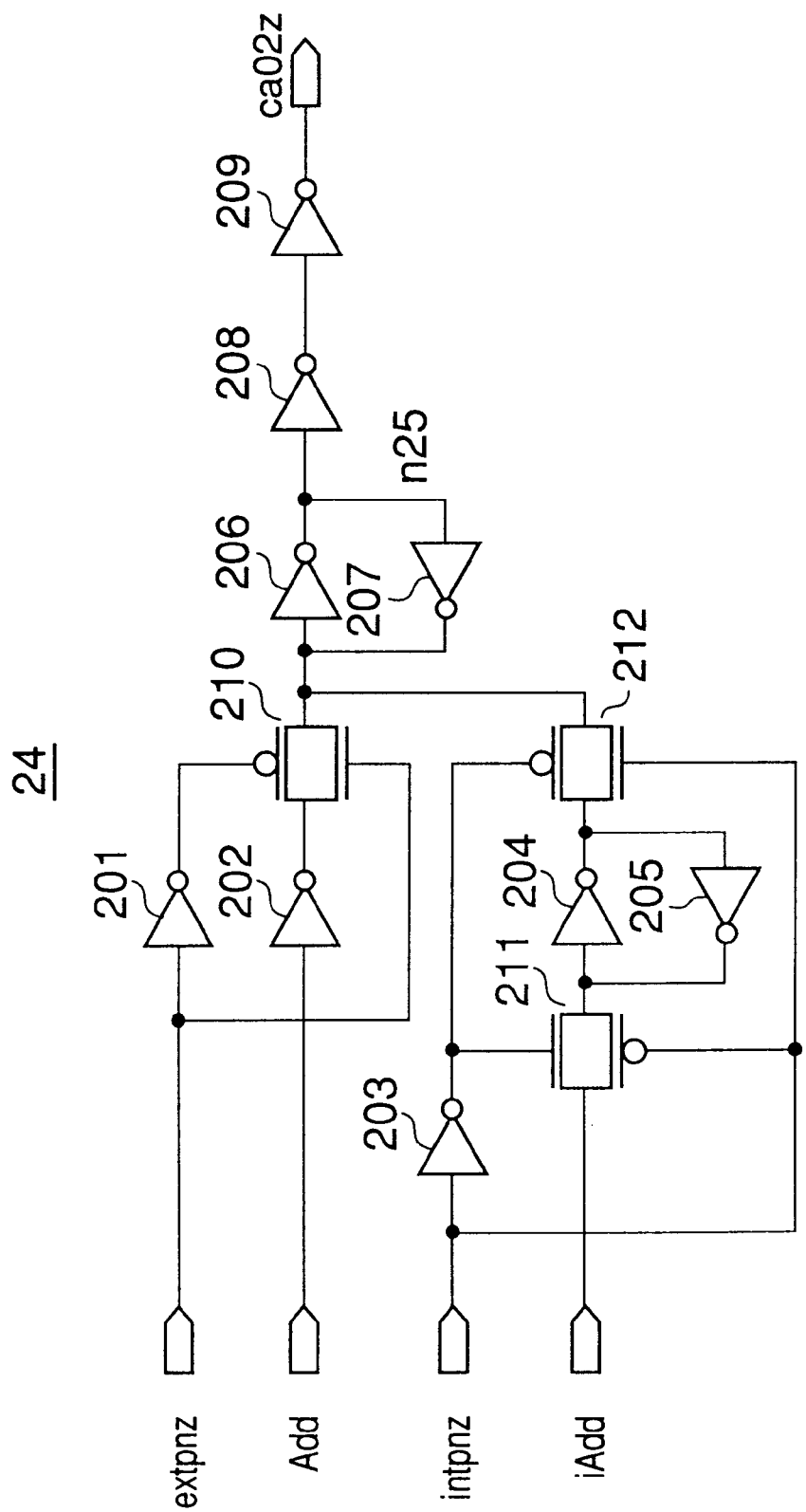
FIG. 9 is a circuit diagram showing a circuit structure of an increment latch.

FIG. 9 is a circuit diagram showing a circuit structure of the increment latch 24.

The increment latch 24 of FIG. 9 includes inverters 201 through 209 and transfer gates 210 through 212. Each of the transfer gates 210 through 212 is made up from a PMOS transistor and an NMOS transistor. When the external-timing-pulse signal extpnz becomes HIGH during a burst-write operation, the transfer gate 210 is opened, so that the external address signal Add is stored as a start address in a latch comprised of the inverters 206 and 207. The address signal stored in the latch is supplied to the address generator 25 via the inverters 208 and 209.

As the internal-timing-pulse signal intpnz is subsequently supplied, the incremented internal address signal iAdd supplied from the address generator 25 (FIG. 3) is latched by a latch comprised of the inverters 204 and 205. The incremented internal address signal iAdd is then stored in the latch made up from the inverters 206 and 207 at a timing when the internal-timing-pulse signal intpnz becomes HIGH. Until the burst operation is completed, the internal address iAdd from the address generator 25 is stored in the latch comprised of the inverters 206 and 207 in response to the internal-timing-pulse signal.

Figure 10:
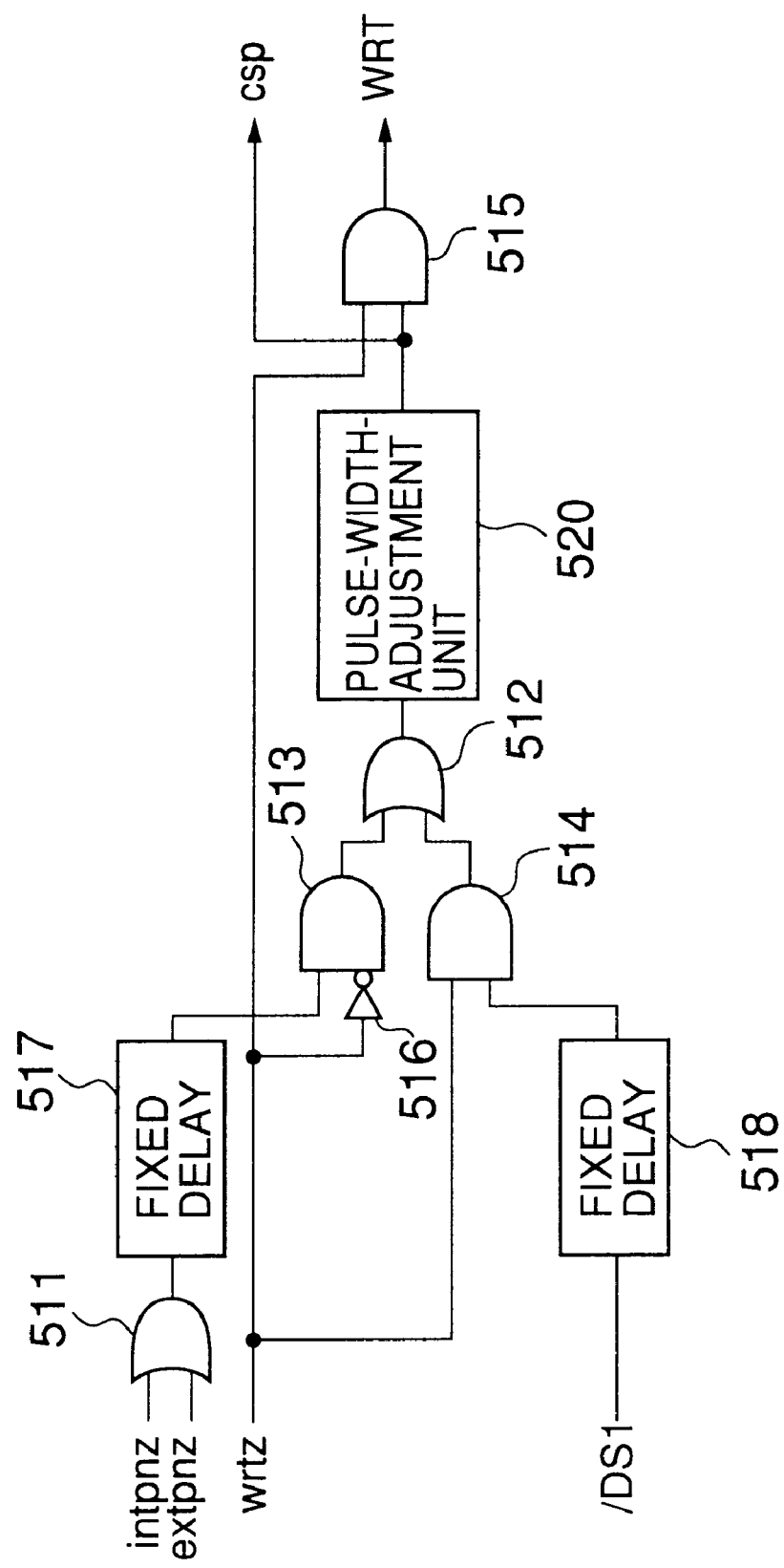
FIG. 10 is a circuit diagram showing a circuit structure of a write-pulse/column-selection-pulse generator.

FIG. 10 is a circuit diagram showing a circuit structure of the write-pulse/column-selection-pulse generator 31.

The write-pulse/column-selection-pulse generator 31 includes OR circuits 511, 512, AND circuits 513–515, an inverter 516, fixed-delay circuits 517 and 518 for timing adjustment, and a pulse-width-adjustment unit 520.

The write-pulse/column-selection-pulse generator 31 generates HIGH pulses as the write-amplifier-activation signal WRT and the column-selection pulse csp in synchronism with the data-strobe signal DS1 when the write-enable signal wrtz is HIGH, i.e, when the write operation is engaged. When the write-enable signal wrtz is LOW as in a read operation, the write-pulse/column-selection-pulse generator 31 generates a HIGH pulse as the column-selection pulse csp and fixes the write-amplifier-activation signal WRT to a LOW level in synchronism with the internal-timing-pulse signal intpnz and the external-timing-pulse signal extpnz.

When the write-enable signal wrtz is HIGH, one input of the AND circuit 513 receives a LOW-level signal via the inverter 516. Because of this, signals originating from the external-timing-pulse signal extpnz and the internal-timingpulse signal intpnz are blocked by the AND circuit 513. Also, the write-enable signal wrtz that is HIGH is supplied to one input of the AND circuit 514. The AND circuit 514 thus permits a passage of the data-strobe signal DS1 having a timing thereof adjusted by the fixed-delay circuit 518. This data-strobe signal is changed into pulses by the pulse-width-adjustment unit 520, and is output as the write-amplifier-activation signal WRT and the column-selection pulse csp. In a sense, the AND circuit 514 serves to output the signal /DS1 which corresponds to a first falling edge of the data-strobe signal DS after the write-enable signal wrtz becomes HIGH. When the write-enable signal wrtz is LOW (i.e., during a read operation), the AND circuit 515 has one input thereof at a LOW level so as to output a signal fixed to a LOW level as the write-amplifier-activation signal WRT. This deactivates the write amplifiers 29 and 30 (FIG. 3). Since the AND circuit 514 has one input thereof at a LOW level, the AND circuit 514 prevents the passage of the data-strobe signal DS1. Since one input of the AND circuit 513 is HIGH because of the LOW level of the write-enable signal wrtz, the AND circuit 513 outputs the internal-timing-pulse signal intpnz or the external-timing-pulse signal ext-pnz having a timing thereof adjusted by the fixed-delay circuit 517. The output from the AND circuit 513 is subjected to signal-shape adjustment by the pulse-width-adjustment unit 520, and is output as the column-selection pulse csp.

Signal-output timings of the write-amplifier-activation signal WRT and the column-selection pulse csp during the write operation are adjusted by the fixed-delay circuit 518. This timing adjustment makes sure that the write amplifiers 29 and 30 are activated after the parallel data is output from the shift register 15 and the data latch 16 and that the predecoders 34 and 35 are activated after an address corresponding to the write data is output from the address generator 33.

A signal-output timing of the column-selection pulse csp during the read operation is adjusted by the fixed-delay circuit 517. This adjustment is to insure that the predecoders 34 and 35 are activated at such a timing as to meet an address that is output by the address generator 33 at an earlier timing than in a write operation.

Figure 11:
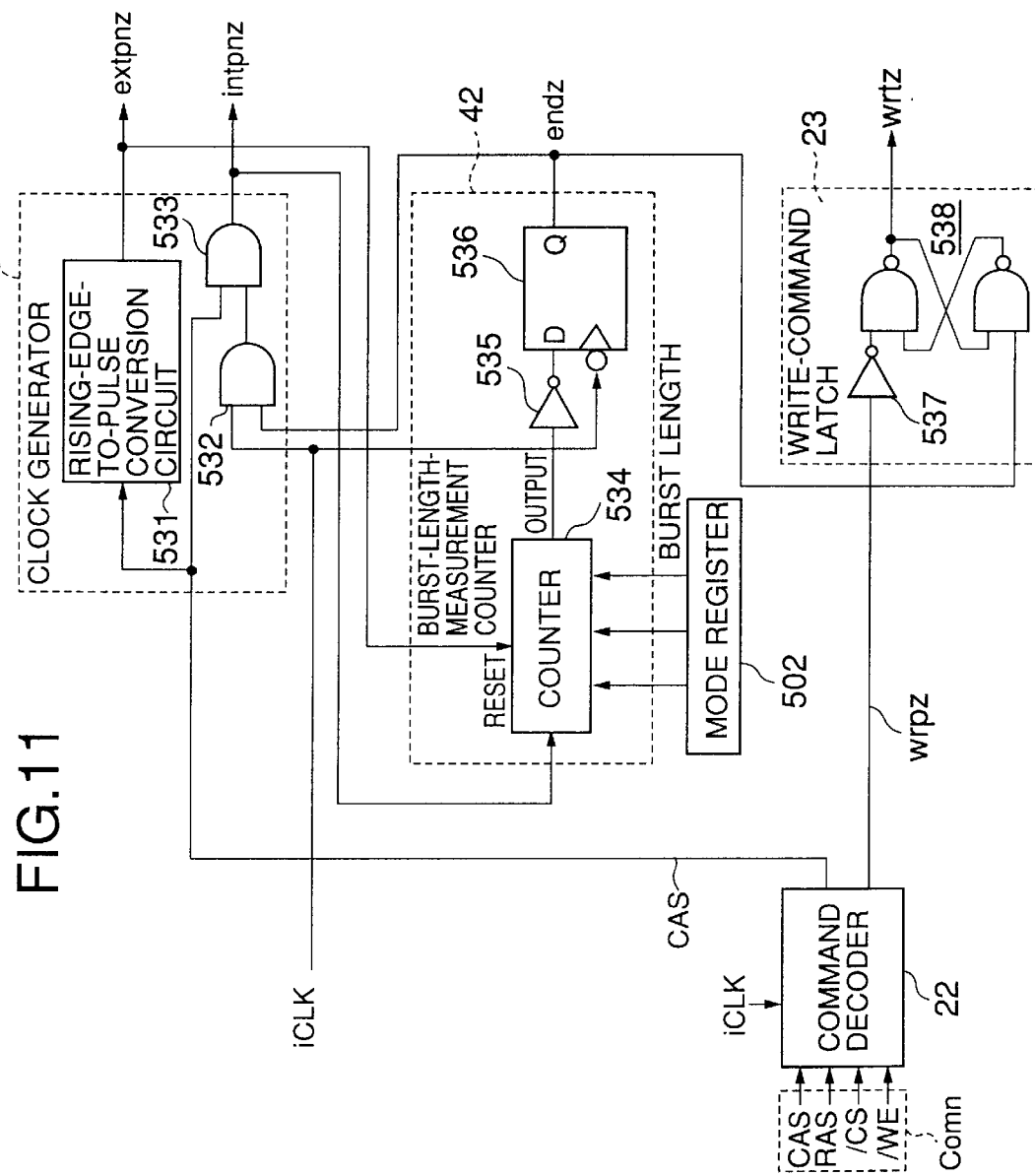
FIG. 11 is a circuit diagram showing details of interconnections between a command decoder, a write-command latch, a burst-length-measurement counter, a mode register, and a clock generator.

FIG. 11 is a circuit diagram showing details of interconnections between the command decoder 22, the write-command latch 23, the burst-length-measurement counter 42, the mode register 502 and the clock generator 501.

The command decoder 22 receives a command in synchronism with an edge of the internal clock signal iCLK, and decodes the command which is defined as a combination of various control signals such as /CAS, /RAS, /CS, /WE, and the like. When the command Comm is a write command, the command decoder 22 outputs the write signal wrpz and the CAS signal that are both HIGH. The clock generator 501 includes a rising-edge-to-pulse conversion circuit 531 and AND circuits 532 and 533. The rising-edge-to-pulse conversion circuit 531 outputs the external-timing-pulse signal extpnz that is HIGH when the CAS signal is supplied. The burst-length-measurement counter 42 includes a counter 534, an inverter 535, and a flip-flop circuit 536. The counter 534 is reset by the external-timing-pulse signal extpnz supplied form the clock generator 501. Because of this, a Q output of the flip-flop 536 (i.e., the burst-end signal endz) becomes HIGH in response to a falling edge of the internal clock signal iCLK. The burst-end signal endz at the HIGH level is supplied to one input of the AND circuit 532 of the clock generator 501, so that the AND circuit 532 outputs the internal clock signal iCLK without any change as it is supplied to the other input thereof. The AND circuit 533 receives at one input thereof the CAS signal that is HIGH, and, thus, outputs the internal clock signal iCLK as the internal-timing-pulse signal intpnz. The counter 534 of the burst-length-measurement counter 42 counts pulses of the internal-timing-pulse signal intpnz supplied from the clock generator 501 until the count reaches the burst length set in the mode register 502. When the count is completed, the counter 534 outputs a HIGH level. In response, the burst-end signal endz becomes LOW. The change to LOW in the burst-end signal endz results in the AND gate 532 blocking the internal clock signal iCLK, thereby stopping the internal-timing-pulse signal intpnz from being output.

The write-command latch 23 includes a latch 538 and an inverter 537. The write-command latch 23 outputs the write-enable signal wrtz that is HIGH when the write signal wrpz of a HIGH level is supplied. When the count of the intpnz-signal pulses by the burst-length-measurement counter 42 is completed so as to change the burst-end signal endz to LOW, the write-command latch 23 resets the write-enable signal wrtz to LOW.

Figure 12:
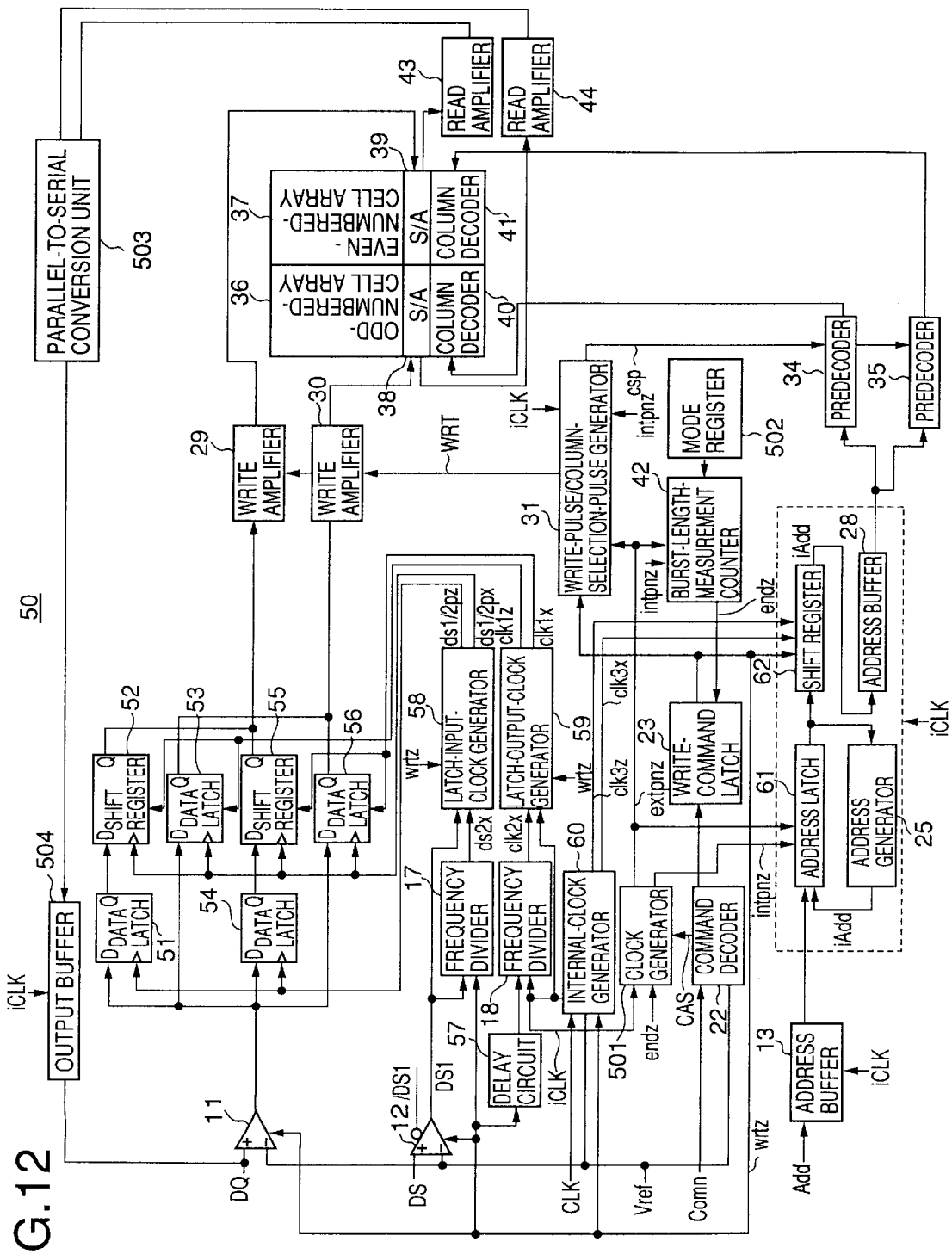
FIG. 12 is a block diagram showing a second embodiment of a semiconductor memory device according to the present invention.

FIG. 12 is a block diagram showing a second embodiment of a semiconductor memory device according to the present invention. In FIG. 12, the same elements as those of FIG. 3 are referred to by the same numerals, and a description thereof will be omitted.

A semiconductor memory device 50 of FIG. 12 includes the data-input buffer 11, the data-strobe-input buffer 12, the address buffer 13, the frequency divider 17, the frequency divider 18, the command decoder 22, the write-command latch 23, the address generator 25, the address buffer 28, the write amplifier 29, the write amplifier 30, the write-pulse/column-selection-pulse generator 31, the predecoder 34, the predecoder 35, the odd-numbered-cell array 36, the even-numbered-cell array 37, the sense amplifier 38, the sense amplifier 39, the column decoder 40, the column decoder 41, the burst-length-measurement counter 42, the read amplifier 43, the read amplifier 44, the clock generator 501, the mode register 502, the parallel-to-serial conversion unit 503, and the output buffer 504, all of which are included in the configuration of FIG. 3. The semiconductor memory device 50 further includes a data latch 51, a shift register 52, a data latch 53, data latch 54, a shift register 55, a data latch 56, a delay circuit 57, a latch-input-clock generator 58, a latch-output-clock generator 59, a internal-clock generator 60 address latch 61, and a shift register 62.

In the first embodiment previously described, the address signal is latched in synchronism with the clock signal CLK, and is supplied from the latches to the internal circuit in synchronism with the data-strobe signal DS, thereby matching timings between the address and the data. In the second embodiment, on the other hand, the address signal is kept synchronized with the clock signal CLK, and the data signal latched in synchronism with the data-strobe signal DS is supplied from latches to the internal circuit in synchronism with the clock signal CLK in order to align timings between the address and the data.

In detail, the address signal Add supplied to the address buffer 13 is latched by the address latch 61 at a rising edge of the clock signal CLK. After this, the shift register 62 delays the address signal Add by 1.5 cycles in time, so that the latched address is supplied to the address buffer 28 1.5 cycles after the input of the address signal Add. No matter when the data-strobe signal DS is provided within a time margin between the shortest tDSS and the longest tDSS, the address is delayed by 1.5 cycles. Data-write operations, therefore, start 1.5 cycles after the input of a command (which occurs at a timing of address input).

In what follows, operations of the semiconductor memory device 50 will be described with regard to a case in which tDSS is the shortest and a case in which tDSS is the longest.

Figure 13:
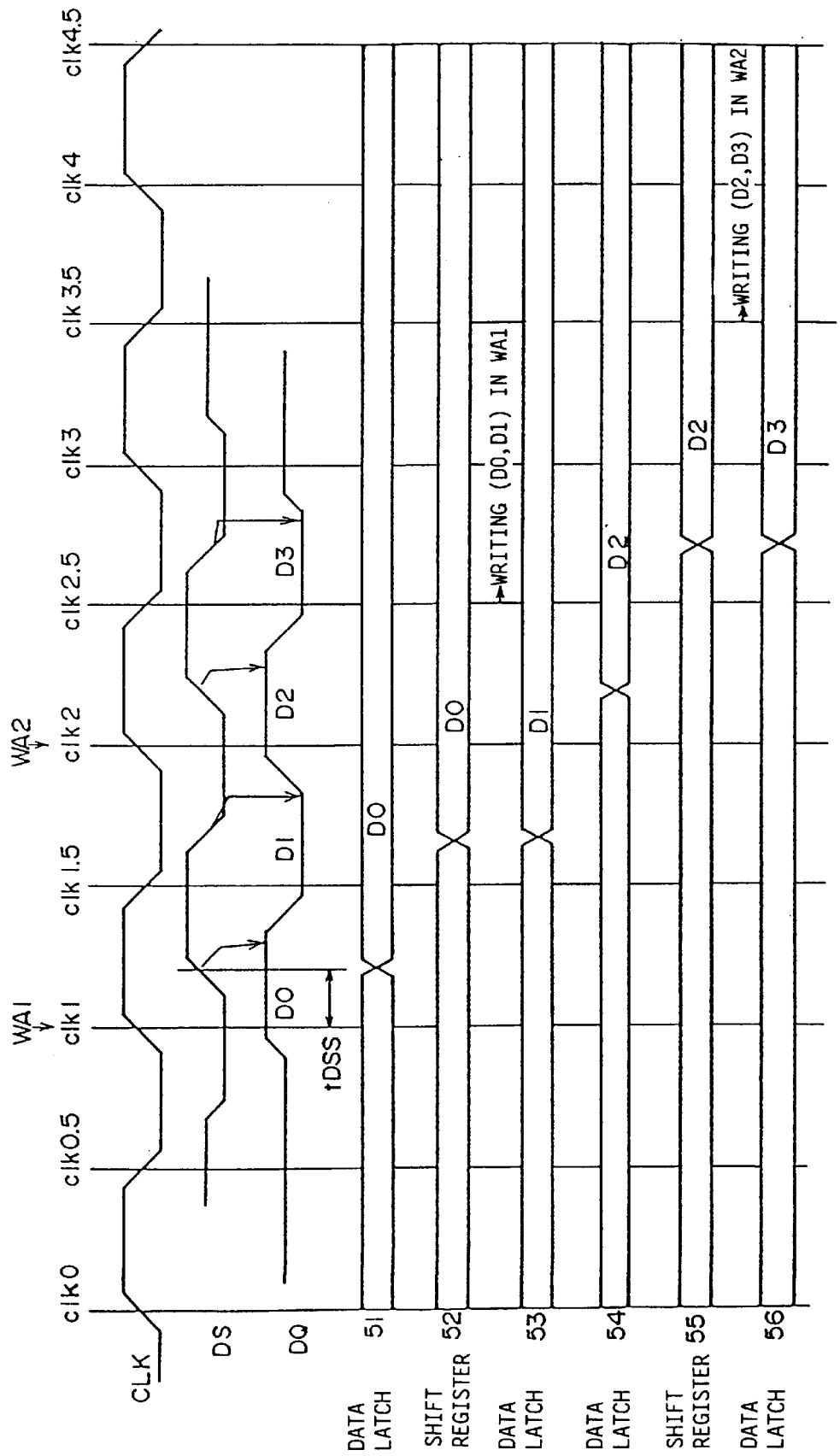
FIG. 13 is a timing chart for explaining operations of the semiconductor memory device of FIG. 12 in the case of the shortest tDSS.

FIG. 13 is a timing chart for explaining operations of the semiconductor memory device 50 in the case of the shortest tDSS. It should be noted that FIG. 13 is provided for the purpose of explanation, and is not intended to show exact details of signal delays introduced by circuit elements.

With reference to FIGS. 12 and 13, where the shortest tDSS is employed, a write command is input, and an external write address WA1 is latched by the address latch 61 in response to a rising edge (clk1) of the clock signal CLK. Data D0 of the data signal DQ is then latched by the data latch 51 in response to a rising edge of the data-strobe signal DS. Further, a following falling edge of the data-strobe signal DS prompts the data latch 53 to latch data D1. At the same time, the data D0 stored in the data latch 51 is transferred to the shift register 52.

In response to a next rising edge (clk2) of the clock signal CLK, a write address WA2 is latched by the address latch 61. When this happens, the writes address WA1, which was previously supplied, is transferred to and stored in the shift register 62. Data D2 of the data signal DQ is then latched by the data latch 54 in response to a rising edge of the data-strobe signal DS. Further, a following falling edge of the data-strobe signal DS prompts the data latch 56 to latch data D3. At the same time, the data D2 stored in the data latch 54 is transferred to the shift register 55.

Concurrently with the operations described above, a data-write operation with respect to the write address WA1 is started 1.5 cycles after the input of the write address WA1 (i.e., at a timing clk2.5). Namely, the write address WA1 is supplied from the shift register 62 to the address buffer 28, and the data D0 of the shift register 52 and the data D1 of the data latch 53 are supplied to the write amplifier 29 and the write amplifier 30, respectively.

Following to this, a data-write operation with respect to the write address WA2 is started 1.5 cycles after the input of the write address WA2 (i.e., at a timing clk3.5). Namely, the write address WA2 is supplied from the shift register 62 to the address buffer 28, and the data D2 of the shift register 55 and the data D3 of the data latch 56 are supplied to the write amplifier 29 and the write amplifier 30, respectively.

Figure 14:
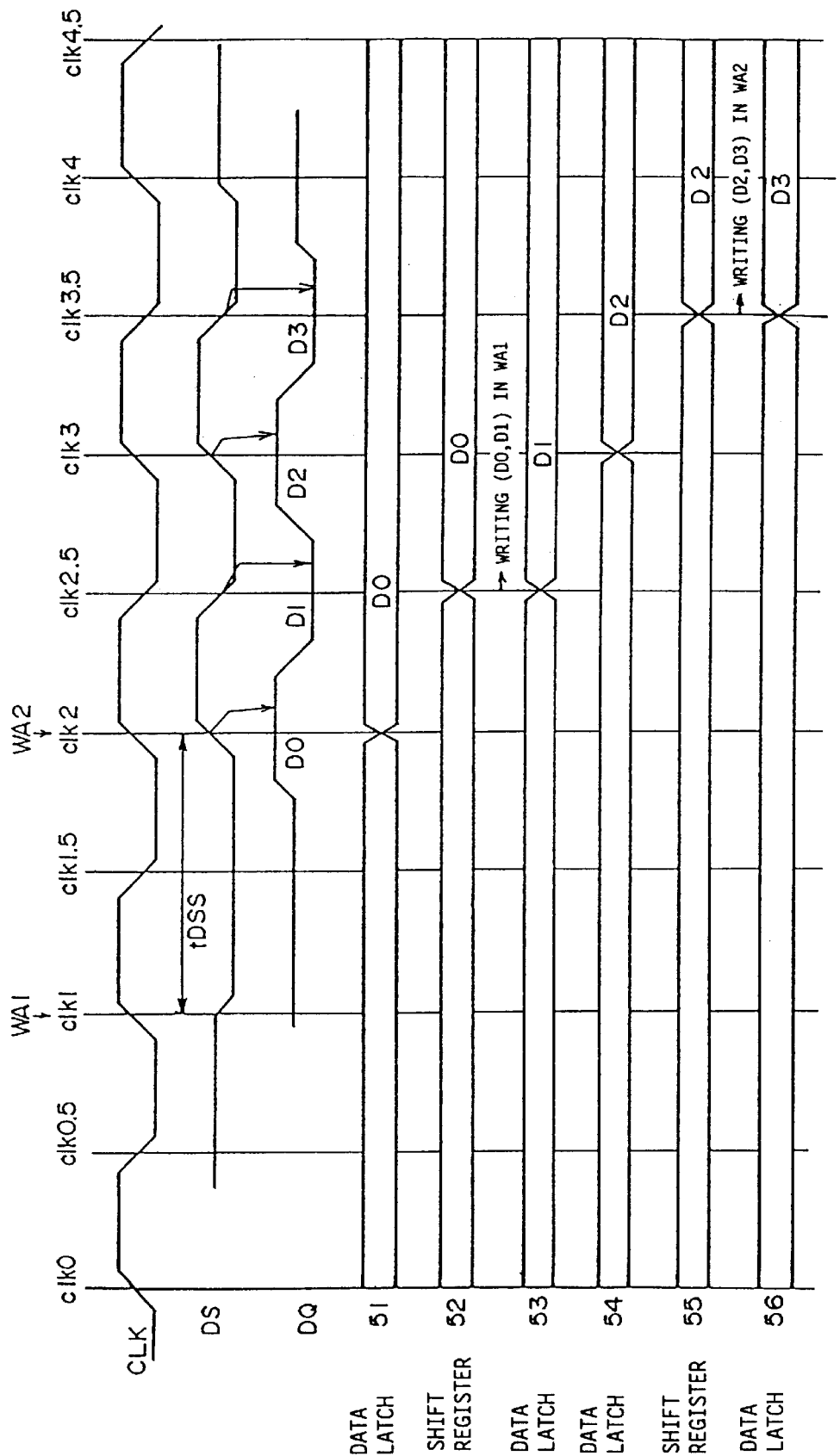
FIG. 14 is a timing chart for explaining operations of the semiconductor memory device of FIG. 12 in the case of the longest tDSS.

FIG. 14 is a timing chart for explaining operations of the semiconductor memory device 50 in the case of the longest tDSS. It should be noted that FIG. 14 is provided for the purpose of explanation, and is not intended to show exact details of signal delays introduced by circuit elements.

With reference to FIGS. 12 and 14, where the longest tDSS is employed, a write command is input, and an external write address WA1 is latched by the address latch 61 in response to a rising edge (clk1) of the clock signal CLK. Further, responding to a next rising edge (clk2) of the clock signal CLK, the address latch 61 latches a write address WA2. As the latter latching operation is performed, the write address WA1, which was previously latched, is transferred to and stored in the shift register 62.

When the write address WA2 is latched by the address latch 61, data D0 of the data signal DQ is latched by the data latch 51 in response to a rising edge of the data-strobe signal DS. Further, a following falling edge of the data-strobe signal DS prompts the data latch 53 to latch data D1. At the same time, the data D0 stored in the data latch 51 is transferred to the shift register 52.

Concurrently with the operations described above, a data-write operation with respect to the write address WA1 is started 1.5 cycles after the input of the write address WA1 (i.e., at a timing clk2.5). Namely, the write address WA1 is supplied from the shift register 62 to the address buffer 28, and the data D0 of the shift register 52 and the data D1 of the data latch 53 are supplied to the write amplifier 29 and the write amplifier 30, respectively.

Subsequent to the above operations, data D2 of the data signal DQ is latched by the data latch 54 in response to a rising edge of the data-strobe signal DS. Further, a following falling edge of the data-strobe signal DS prompts the data latch 56 to latch data D3. At the same time, the data D2 stored in the data latch 54 is transferred to the shift register 55.

A data-write operation with respect to the write address WA2 is started 1.5 cycles after the input of the write address WA2 (i.e., at a timing clk3.5). Namely, the write address WA2 is supplied from the shift register 62 to the address buffer 28, and the data D2 of the shift register 55 and the data D3 of the data latch 56 are supplied to the write amplifier 29 and the write amplifier 30, respectively.

In this manner, the second embodiment of the present invention keeps the address signal in synchronism with the clock signal CLK, and, upon receiving the data signal in synchronism with the data-strobe signal DS, supplies the data signal at appropriate timings synchronized with the clock signal CLK. These timings may be set to an end of a predetermined clock-cycle period starting from the input of a data-write address. This makes it possible to supply the address and the data simultaneously to the internal circuit in synchronism with the clock signal CLK, thereby performing an appropriate data-write operation.

Figure 15:
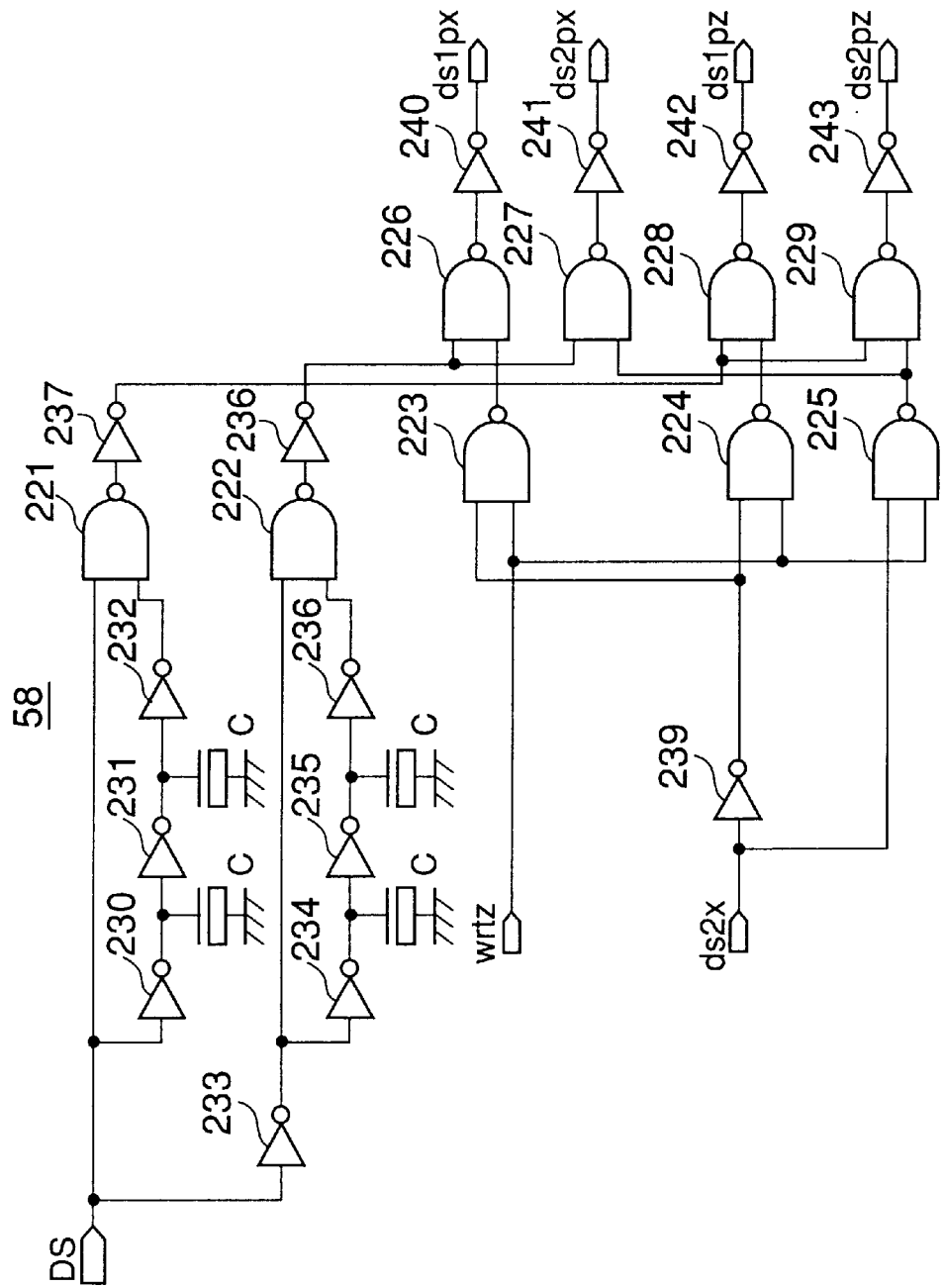
FIG. 15 is a circuit diagram showing a circuit configuration of a latch-input-clock generator.

FIG. 15 is a circuit diagram showing a circuit configuration of the latch-input-clock generator 58.

The latch-input-clock generator 58 of FIG. 15 includes NAND circuits 221 through 229, inverters 230 through 243, and a plurality of capacitors C.

The data-strobe signal DS1 supplied from the data-strobe-input buffer 12 is delayed by a series of delay elements comprised of the inverters 230 through 232 and a plurality of the capacitors C. The NAND circuit 221 and the inverter 237 perform an AND operation between the delayed and inverted data-strobe signal and the data-strobe signal DS, thereby generating a pulse signal becoming HIGH at rising edges of the data-strobe signal DS. This pulse signal is output as the latch-input clock ds1pz via the NAND circuit 228 and the inverter 242 when the frequency-divided-data-strobe signal ds2x is HIGH. When the frequency-divided-data-strobe signal ds2x is LOW, on the other hand, the pulse signal is output as the latch-input clock ds2pz via the NAND circuit 229 and the inverter 243.

Figure 4:
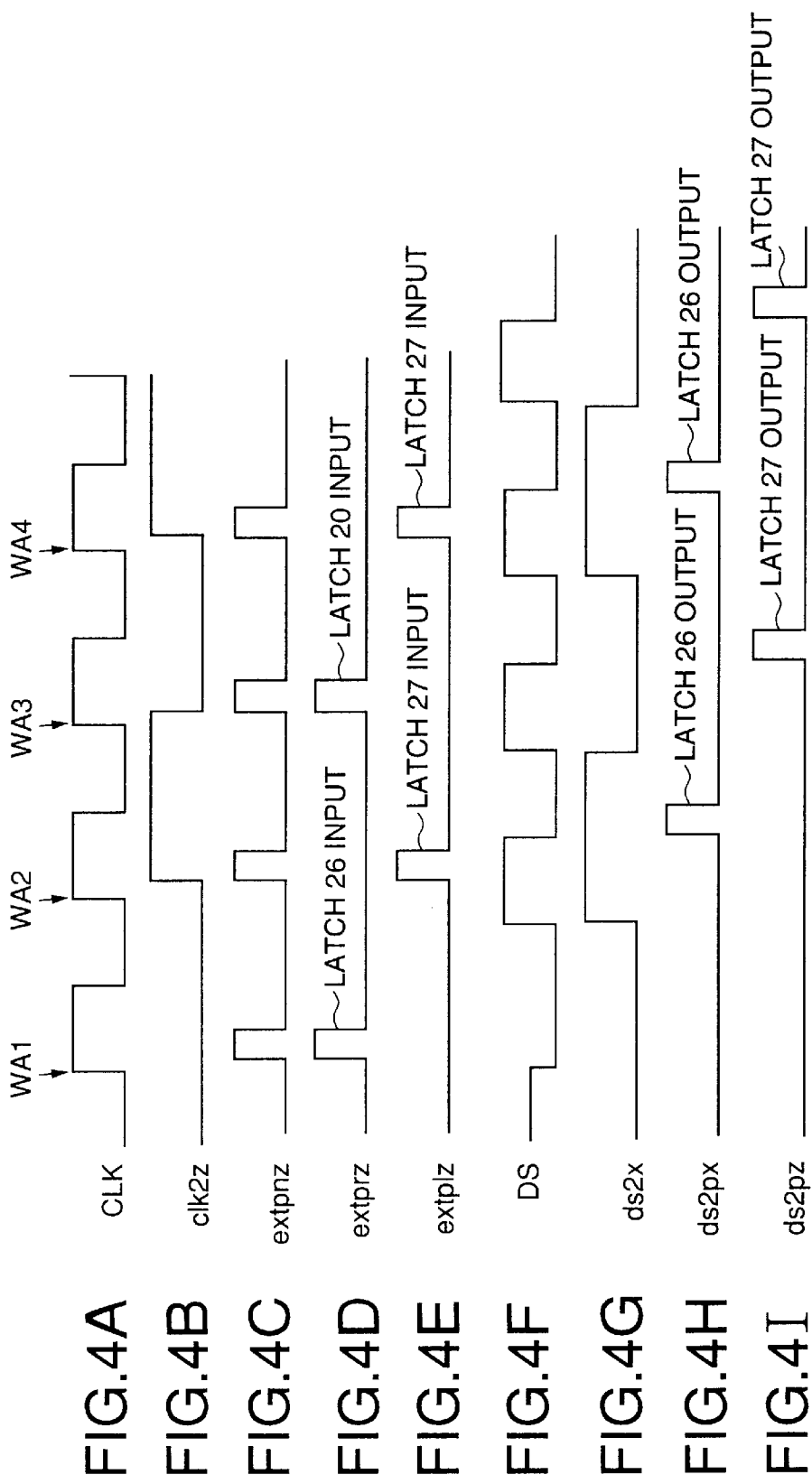
FIGS. 4A through 4I are timing charts showing input/output timings of latches.

The frequency-divided-data-strobe signal ds2x becomes HIGH first in response to a first rising edge of the data-strobe signal DS as shown in FIG. 4. In response to a next rising edge of the data-strobe signal DS, the frequency-divided-data-strobe signal ds2x changes to LOW. The latch-input-clock generator 58 thus outputs ds1pz first, and then outputs ds2pz one clock cycle later in terms of the clock cycles of the data-strobe signal DS.

The data-strobe signal DS1 input to the inverter 233 is delayed by a series of delay elements comprised of the inverters 234 through 236 and a plurality of the capacitors C. The NAND circuit 222 and the inverter 238 perform an AND operation between an inverse of the data-strobe signal DS1 and the delayed data-strobe signal, thereby generating a pulse signal becoming HIGH at falling edges of the data-strobe signal DS1. This pulse signal is output as the latch-input clock ds1px via the NAND circuit 226 and the inverter 240 when the frequency-divided-data-strobe signal ds2x is HIGH. When the frequency-divided-data-strobe signal ds2x is LOW, on the other hand, the pulse signal is output as the latch-input clock ds2px via the NAND circuit 227 and the inverter 241.

The frequency-divided-data-strobe signal ds2x becomes HIGH first in response to a first rising edge of the data-strobe signal DS as shown in FIG. 4. In response to a next rising edge of the data-strobe signal DS, the frequency-divided-data-strobe signal ds2x changes to LOW. The latch-input-clock generator 58 thus outputs ds1px first, and then outputs ds2px one clock cycle later in terms of the clock cycles of the data-strobe signal DS. In this manner, the latch-input-clock generator 58 outputs pulse signals ds1pz, ds1px, ds2pz, and ds2px successively in this order.

The latch-input clocks ds1pz and ds2pz generated as described above are supplied to the data latches 51 and 54, respectively In synchronism with the rising edges of the data-strobe signal DS, therefore, odd-number input data (D0, D2) as shown in FIGS. 13 and 14 are latched by the data latches 51 and 54 in turn. Further, the latch-input clocks ds1px and ds2px are supplied to the data latches 53 and 56, respectively, so that the even-number input data (D1, D3) as shown in FIGS. 13 and 14 are latched by the data latches 53 and 56 in turn in synchronism with the falling edges of the data-strobe signal DS. By the same token, the shift registers 52 and 55 store the even-number data in turn in synchronism with the falling edges of the data-strobe signal DS. In this manner, the shift register 52, the data latch 53, the shift register 55, and the data latch 56 respectively store four pieces of write data D0, D1, D2, and D3 successively in this order as these pieces of data are supplied serially.

Figure 16:
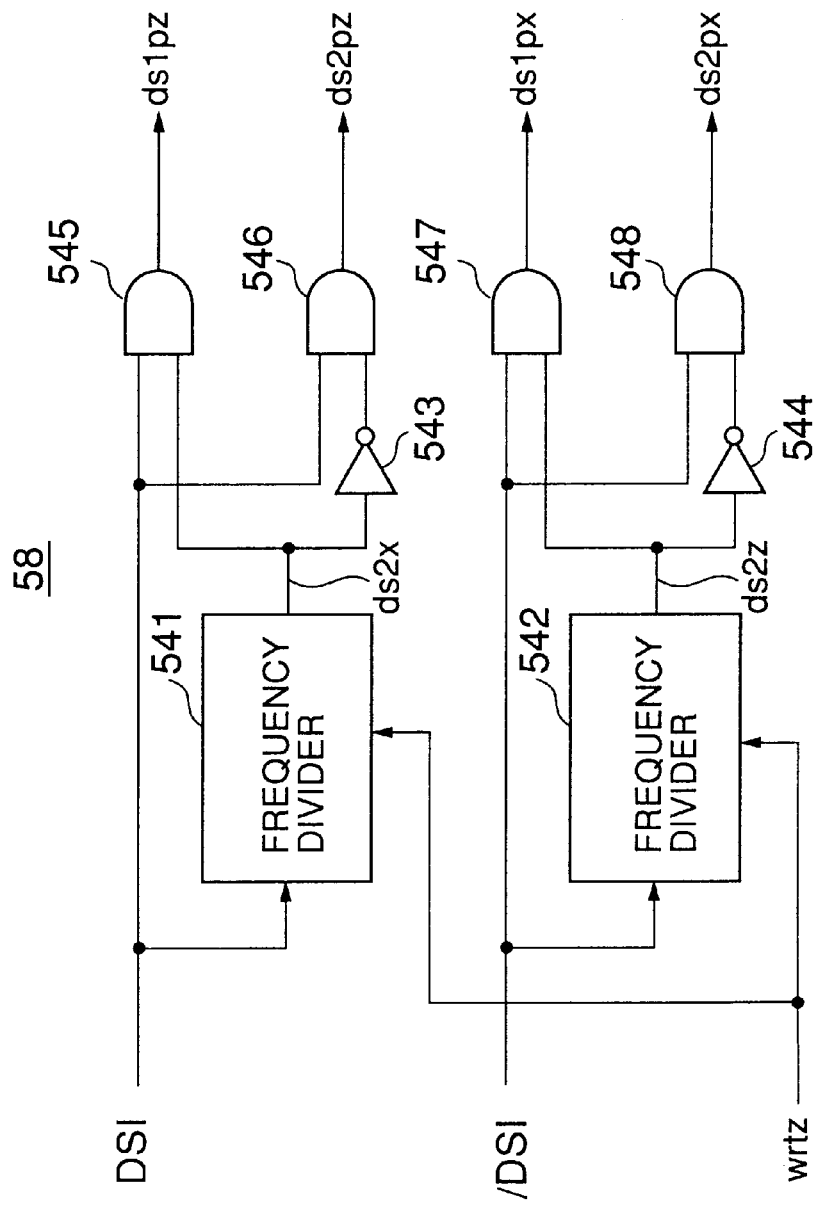
FIG. 16 is a circuit diagram showing another configuration of the latch-input-clock generator.

FIG. 16 is a circuit diagram showing another configuration of the latch-input-clock generator 58. The latch-input-clock generator 58 of the figure includes frequency dividers 541, 542, inverters 543, 544, and AND circuits 545–548.

The frequency divider 541 divides by half a frequency of the data-strobe signal DS1 supplied from the data-strobe-input buffer 12 to generate the frequency-divided-data-strobe signal ds2x when the write-enable signal wrtz is HIGH. The AND circuit 545 outputs the data-strobe signal DS1 when the frequency-divided-data-strobe signal ds2x is HIGH, and supplies a HIGH-level signal ds1pz to the data latch 51 in response to a first rising edge of the data-strobe signal DS1. The AND circuit 546 outputs the data-strobe signal DS1 when the frequency-divided-data-strobe signal ds2x is LOW, and supplies a HIGH-level signal ds2pz to the data latch 54 in response to a next rising edge of the data-strobe signal DS1.

The frequency divider 542 divides by half a frequency of the data-strobe signal /DS1 supplied from the data-strobe-input buffer 12 to generate the frequency-divided-data-strobe signal ds2z when the write-enable signal wrtz is HIGH. The AND circuit 547 outputs the data-strobe signal /DS1 when the frequency-divided-data-strobe signal ds2z is HIGH, and supplies a HIGH-level signal ds1px to the shift register 52 and the data latch 53 in response to a first falling edge of the data-strobe signal DS1. The AND circuit 548 outputs the data-strobe signal /DS1 when the frequency-divided-data-strobe signal ds2z is LOW, and supplies a HIGH-level signal ds2px to the shift register 55 and the data latch 56 in response to a next falling edge of the data-strobe signal DS1.

In this manner, the latch-input-clock generator 58 outputs signals ds1pz, ds1px, ds2pz, and ds2px successively in this order in response to the rising edges and falling edges of the data-strobe signal DS1.

Figure 17:
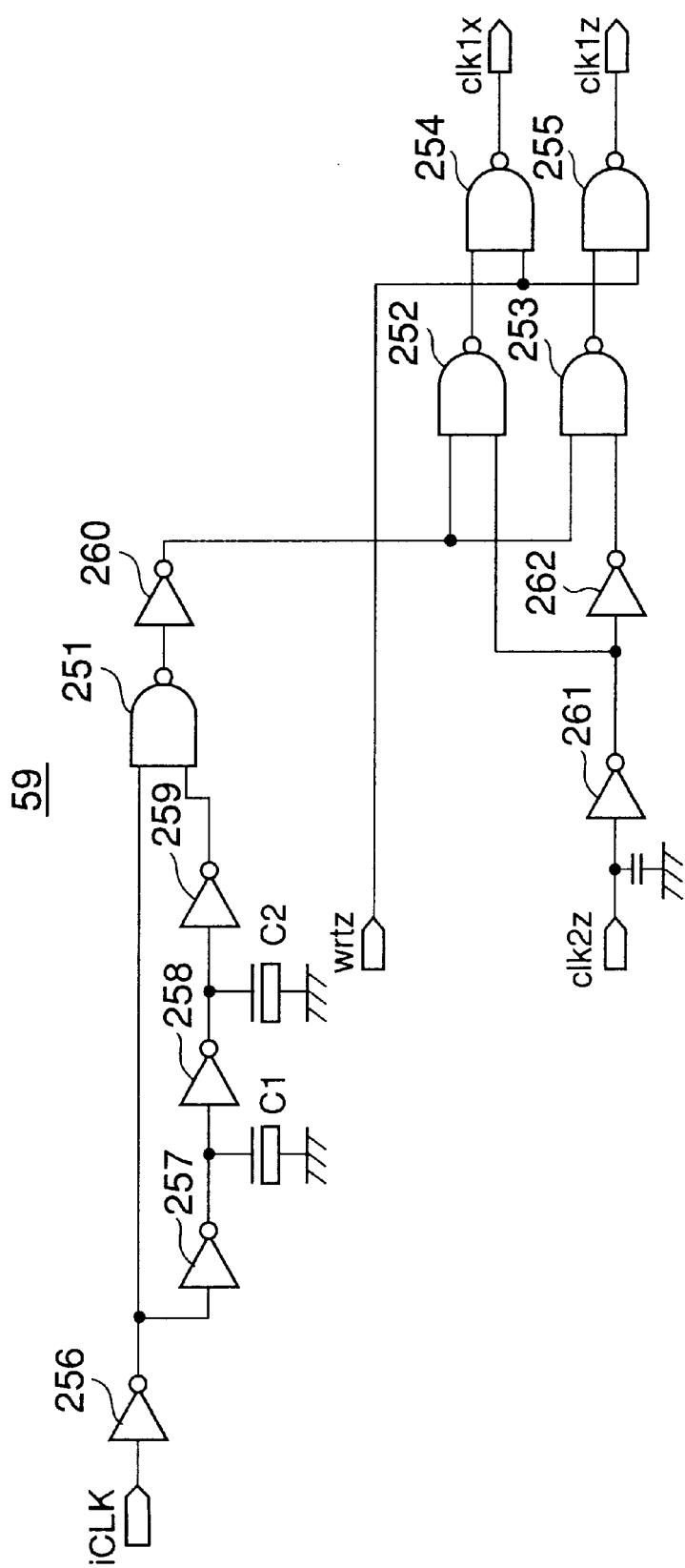
FIG. 17 is a circuit diagram showing a circuit structure of a latch-output-clock generator.

FIG. 17 is a circuit diagram showing a circuit structure of the latch-output-clock generator 59.

The latch-output-clock generator 59 of FIG. 17 includes NAND circuit 251 through 255, inverters 256 through 262, and capacitors C1 and C2. The internal-clock signal iCLK input to the inverter 256 is delayed by a series of delay elements comprised of the inverters 257 through 259 and the capacitors C1 and C2. The NAND circuit 251 and the inverter 260 perform an AND operation between an inverse of the internal-clock signal iCLK and the delayed internal-clock signal, thereby generating a pulse signal becoming HIGH at falling edges of the internal-clock signal iCLK. This pulse signal is output as the latch-output clock clk1z via the NAND circuits 253 and 255 when the frequency-divided-clock signal clk2z is HIGH. When the frequency-divided-clock signal clk2z is LOW, on the other hand, the pulse signal is output as the latch-output clock clk1x via the NAND circuits 252 and 254.

In this example, the frequency-divided-clock signal clk2z first becomes HIGH and then changes to LOW, so that the latch-output-clock generator 59 first outputs clk1z and then outputs clk1x. Accordingly, the shift register 52 and the data latch 53 outputs the write data D0 and D1, respectively, and, then, the shift register 55 and the data latch 56 outputs the next write data D2 and D3, respectively.

As described above, the shift register 52 and the data latch 53 (or the shift register 55 and the data latch 56) need to output the stored data 1.5 clock cycles after the inputting of a corresponding address. To this end, the second embodiment of the present invention delays the write-enable signal by one clock cycle by using the delay circuit 57. This insures that the latch-output-clock generator 59 does not output clk1z and clk1x at a falling edge of the internal clock signal iCLK 0.5 clock after the address input.

Figure 18:
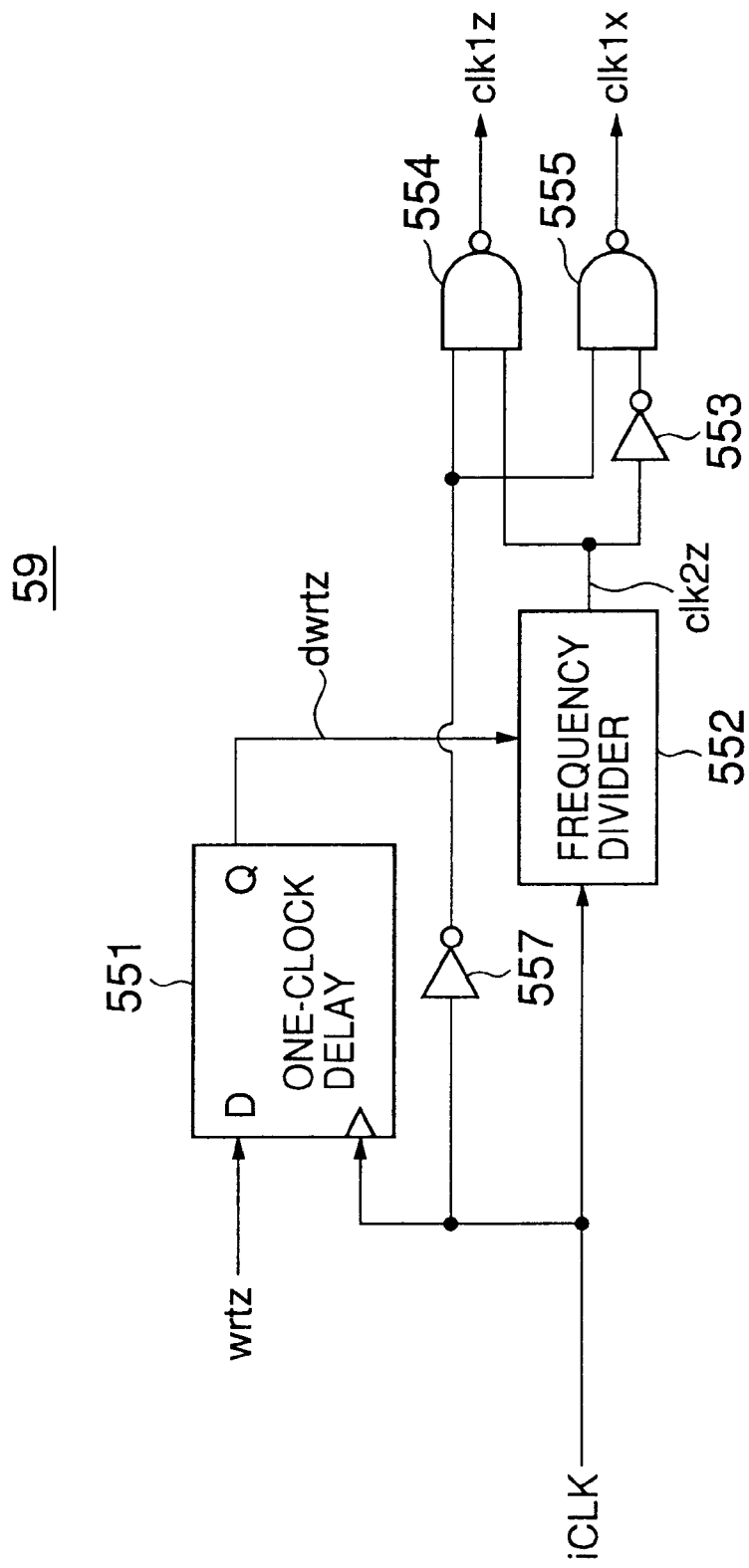
FIG. 18 is a circuit diagram showing another configuration of the latch-output-clock generator.

FIG. 18 is a circuit diagram showing another configuration of the delay circuit 57, the frequency divider 18, and the latch-output-clock generator 59.

The circuit of FIG. 18 includes a one-clock delay 551, a frequency divider 552, inverters 553, 557, and AND circuits 554 and 555. The one-clock delay 551 is comprised of a DQ flip-flop, and delays the write-enable signal wrtz by one clock cycle, thereby outputting a signal dwrtz. The frequency divider 552 is activated by the signal dwrtz, and divides a frequency of the internal clock signal iCLK by half to output a frequency-divided-clock signal clk2z. The AND circuit 554 supplies an inverse of the internal clock signal iCLK as a clk1z signal to the shift register 52 and the data latch 53 when the frequency-divided-clock signal clk2z is HIGH. In other words, the AND circuit 554 outputs the clk1z signal that is HIGH in response to a falling edge of the internal clock signal iCLK 1.5 clock cycles after the address corresponding to the first data set (D0, D1) is acquired. The AND circuit 555 supplies an inverse of the internal clock signal iCLK as a clk1x signal to the shift register 55 and the data latch 56 when the frequency-divided-clock signal clk2z is LOW. In other words, the AND circuit 555 outputs the clk1x signal that is HIGH in response to a falling edge of the internal clock signal iCLK 1.5 clock cycles after the address corresponding to the second data set (D2, D3) is acquired. In this manner, the latch-output-clock generator 59 prompts the shift register 52 and the data latch 53 to output the data thereof in parallel at an end of a 1.5-clock-cycle period after the acquisition of the first address, and prompts the shift register 55 and the data latch 56 to output the data thereof in parallel at an end of a 1.5-clock-cycle period after the acquisition of the second address.

The latch-output clock clk1z generated in such a manner is supplied to the shift register 52 and the data latch 53, so that the stored data is output to the internal circuit in synchronism with a falling edge of the clock signal CLK at an end of the 1.5-clock-cycle period from the inputting of the corresponding address. Further, the latch-output clock clk1x is supplied to the shift register 55 and the data latch 56, so that the a falling edge of the clock signal CLK at an end of a 1.5-clock-cycle period from the corresponding address input prompts the outputting of stored data to the internal circuit.

Figure 19:
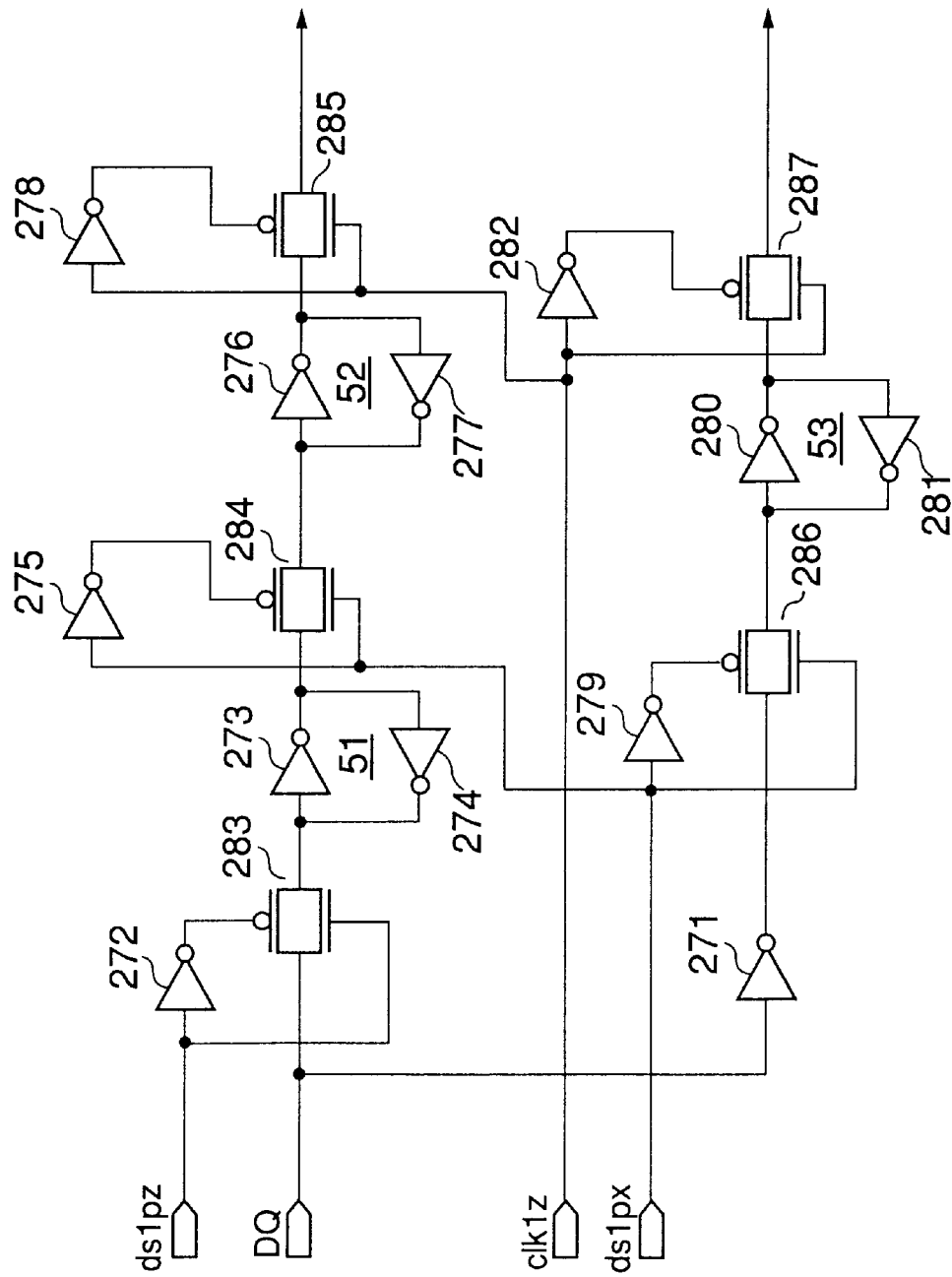
FIG. 19 is a circuit diagram showing circuit structures of a data latch, a shift register, and a data latch.

FIG. 19 is a circuit diagram showing circuit structures of the data latch 51, the shift register 52, and the data latch 53. The data latch 54, the shift register 55, and the data latch 56 also have the same circuit structures as these shown in the figure.

The circuit of FIG. 19 includes inverters 271 through 282 and transfer gates 283 through 287. Each of the transfer gates 283 through 287 is comprised of a PMOS transistor and an NMOS transistor. The inverters 273 and 274 together make up a latch portion corresponding to the data latch 51, and the inverters 276 and 277 together form a latch corresponding to the shift register 52. Further, the inverters 280 and 281 together make up a latch portion corresponding to the data latch 53.

Such circuit configuration as shown in FIG. 19 implements operations in which the data latch 51 stores odd-number data (D0) in response to the latch-input pulse ds1pz, and the data latch 53 stores the even-number data (D1) in response to the latch-input pulse ds1px, while the latch-input pulse also prompts the shift register 52 to store the odd-number data transferred from the data latch 51. Further, the latch-output pulse clk1z is used for outputting the data to the internal circuit at an appropriate timing, i.e, outputting the data in response to a falling edge of the clock signal CLK at an end of a 1.5-clock-cycle period after the acquisition of the corresponding address.

Figure 20:
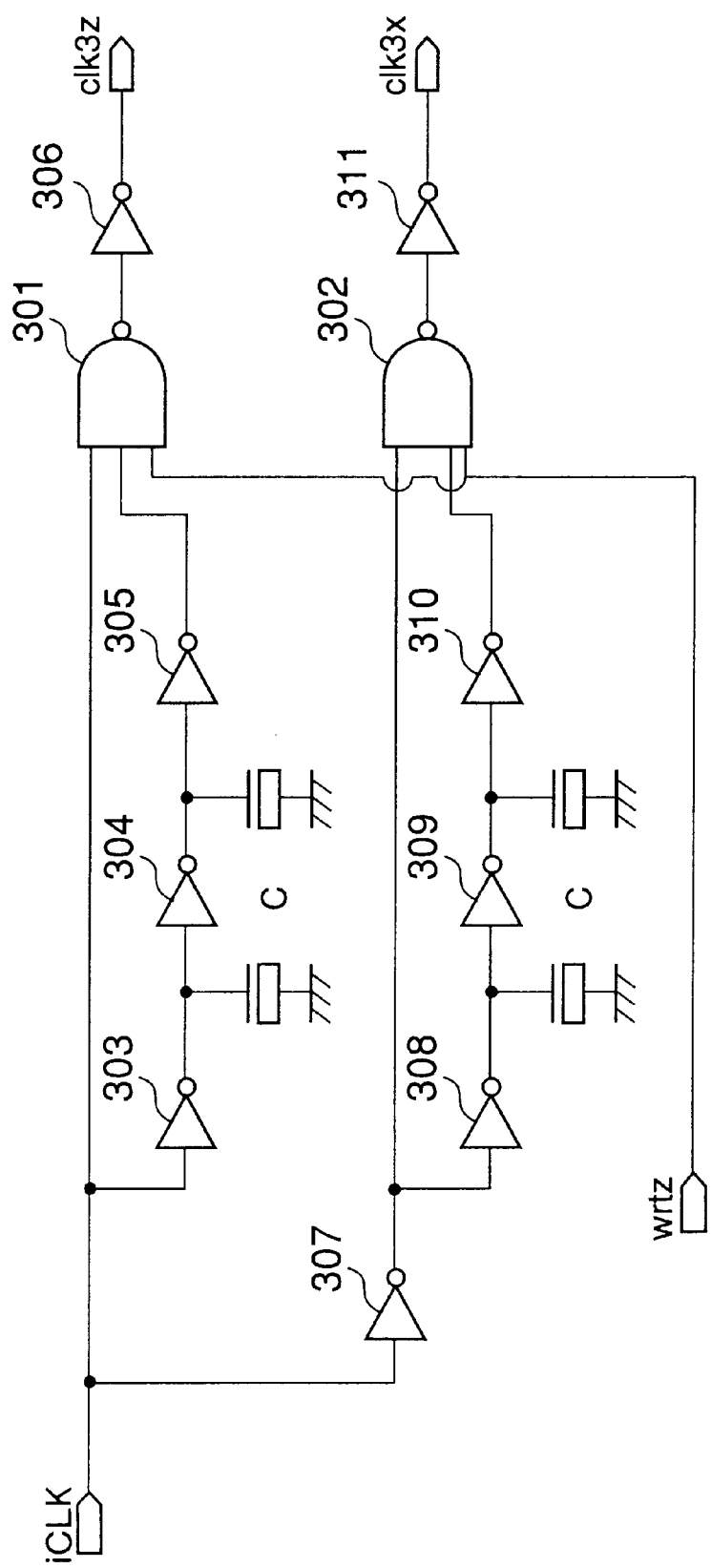
FIG. 20 is a circuit diagram showing a relevant portion of an internal-clock generator which generates timing signals used for controlling a 1.5-clock-cycle delay.

FIG. 20 is a circuit diagram showing a relevant portion of the internal-clock generator 60 which generates timing signals clk3az and clk3x used for control of the 1.5-clock-cycle delay.

The circuit of FIG. 20 includes NAND circuit 301 and 302, inverters 303 through 311, and a plurality of capacitors C.

The internal clock signal iCLK is delayed by a series of delay elements comprised of the inverters 303 through 305 and a plurality of the capacitors C. The NAND circuit 301 and the inverter 306 performs an AND operation between the delayed and inverted internal clock signal and the internal clock signal iCLK, thereby producing a pulse signal becoming HIGH at rising edges of the internal clock signal iCLK. This pulse signal is output as the timing signal clk3z.

The internal clock signal iCLK input to the inverter 307 is delayed by a series of delay elements comprised of the inverters 308 through 310 and a plurality of the capacitors C. The NAND circuit 302 and the inverter 311 performs an AND operation between an inverse of the internal clock signal iCLK and the delayed internal clock signal, thereby producing a pulse signal becoming HIGH at falling edges of the internal clock signal iCLK. This pulse signal is output as the timing signal clk3x. When the write-enable signal wrtz is LOW, both of the timing signals clk3z and clk3x are LOW. These signals clk3z and clk3x are supplied to the shift register 62.

Figure 21:
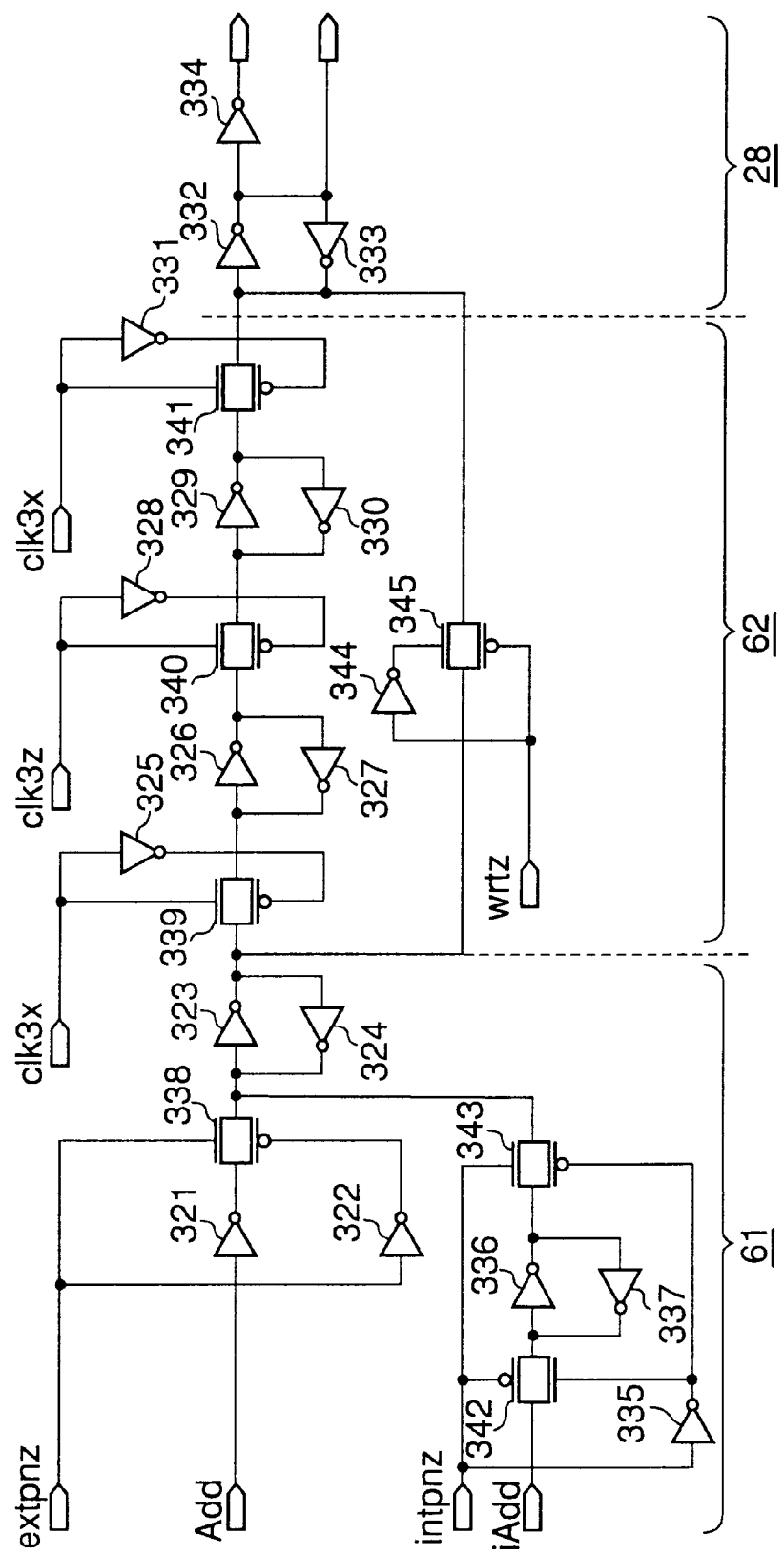
FIG. 21 is a circuit diagram showing circuit structures of an address latch, a shift register, and an address buffer.

FIG. 21 is a circuit diagram showing circuit structures of the address latch 61, the shift register 62, and the address buffer 28.

The circuit of FIG. 21 includes inverters 321 through 337 and transfer gates 338 through 343 and 345. Each of the transfer gates 338 through 343 and 345 is comprised of a PMOS transistor and an NMOS transistor. The inverters 323 and 324 together make up a latch portion corresponding to the address latch 61. Further, a latch comprised of the inverters 326 and 327 and a latch formed by the inverters 329 and 330 together form a circuit portion corresponding to the shift register 62. Further, the inverters 332 and 333 together make up a latch portion corresponding to the address buffer 28.

When the external-timing-pulse signal extpnz becomes HIGH, the transfer gate 338 opens, so that the latch comprised of the inverters 323 and 324 latches the external address signal Add. In response to an immediately following falling edge of the clock signal CLK, the timing signal clk3x becomes HIGH, so that the address signal is stored in the latch comprised of the inverters 326 and 327. Then, the latch comprised of the inverters 329 and 330 latches the address signal when a subsequent rising edge of the clock signal CLK is supplied. Finally, in response to a following falling edge of the clock signal CLK, the address data stored in the latch is supplied to the address buffer 28.

When the internal address iAdd is to be stored in the address latch 61 in a burst-write operation, the internal-timing-pulse signal intpnz instead of the external-timing-pulse signal extpnz becomes HIGH. The subsequent operations of the shift register 62 are the same as described above.

The internal address iAdd is generated by the address generator 25 (FIG. 12). The address generator 25 adds 1 to an address supplied from the address latch 61 so as to generate the internal address iAdd.

In this manner, the shift register 62 introduces a delay equivalent to 1.5 cycles of the clock signal CLK. During a read operation, the write-enable signal wrtz becomes LOW, so that the address latched by the address latch 61 is supplied to the address buffer 28 via the transfer gate 345 without incurring an unnecessary delay in the shift register 62. That is, only a minimum time period passes from the input of the read command before the output becomes available. In this case, the clk3x and clk3z signals are LOW, thereby preventing the address signal from passing through the normal path of the shift register 62.

Figure 22:
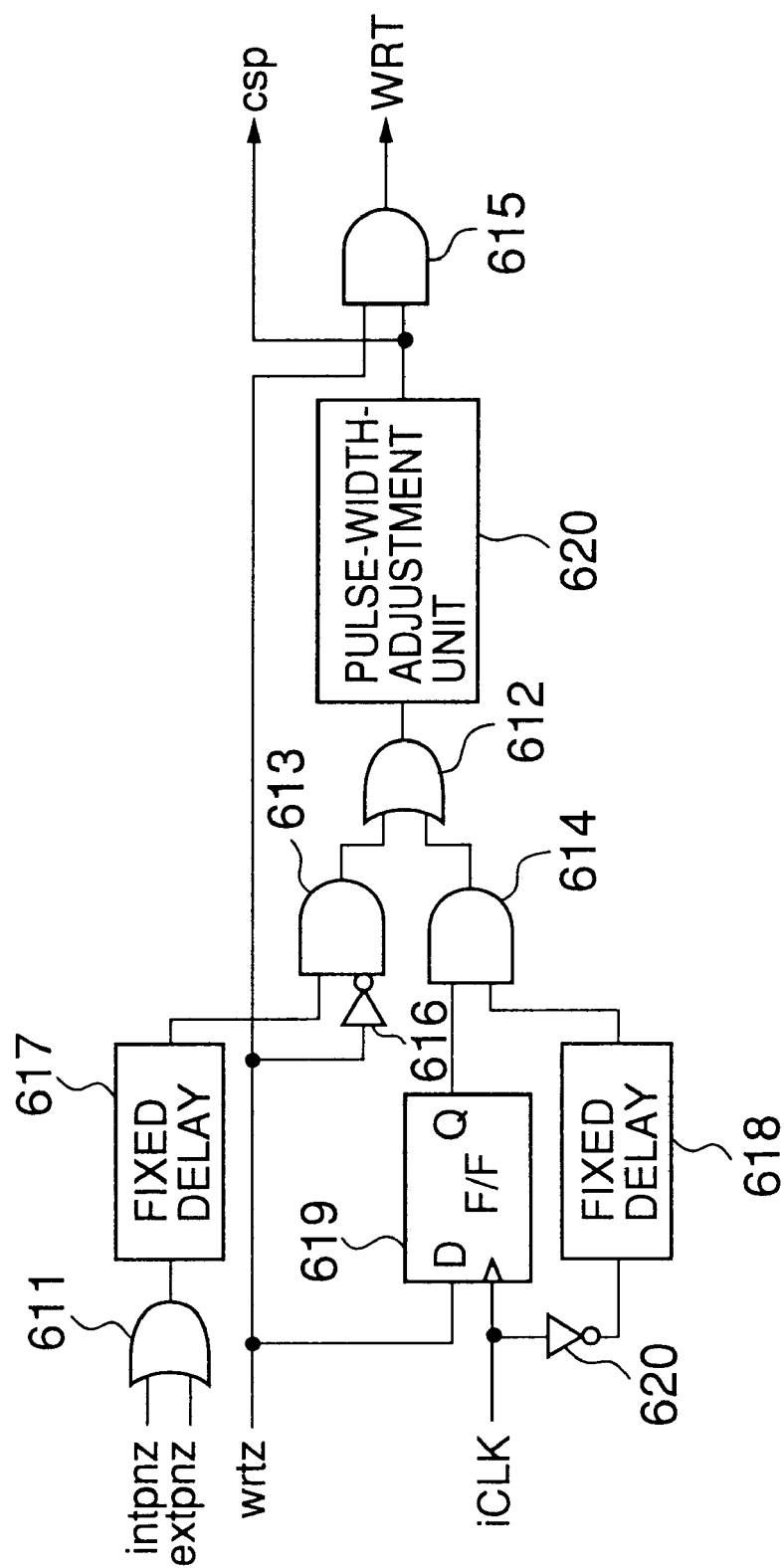
FIG. 22 is a circuit diagram showing a circuit structure of a write-pulse/column-selection-pulse generator.

FIG. 22 is a circuit diagram showing a circuit structure of the write-pulse/column-selection-pulse generator.

This circuit includes OR circuits 611, 612, AND circuits 613, 614, 615, inverters 616, 621, fixed delays 617 and 618 for timing adjustment, one-clock delay 619, and a pulse-width adjustment unit 620. A circuit configuration of this circuit is basically the same as that of the first embodiment shown in FIG. 10. However, the circuit of FIG. 10 has the fixed delay 518 receiving the data-strobe signal DS1 while the circuit of FIG. 22 has the fixed-delay circuit 618 which receives the internal clock signal iCLK. Because of this difference, the circuit of FIG. 22 outputs the write-amplifier-activation signal WRT and the column-selection pulse csp in synchronism with the internal clock signal iCLK during the write operation (wrtz: H) whereas operations of the read operation (wrtz: L) are identical between the two circuits.

Another difference is that the circuit of FIG. 22 is provided with the one-clock delay 619. As is apparent from FIGS. 4 and 5, the first write data D0 and D1 are not written in the internal circuit until at least 1.5 clock cycles after the inputting of the corresponding write command regardless of whether tDSS is the shortest or the longest. The one-clock delay 619 is provided in order to insure that the write-amplifier-activation signal WRT and the column-selection pulse csp are not generated prior to a timing of the falling edge of the internal clock signal iCLK that corresponds to an end of the 1.5-cycle period.

In the first embodiment previously described, two address latches (latches 26 and 27) are provided, whereas the second embodiment is provided with two sets of data latches. The number of these latches or the number of these data latches is not limited to two, but, as is apparent from the disclosure, may be more than two depending on the length of the longest tDSS.

In the following, third and fourth embodiments will be described.

In the first embodiment, two latches (i.e., the latches 26 and 27) are provided for the purpose of latching addresses. Because of this, the case of the shortest tDDS as shown in FIG. 1 and the case of the longest tDDS as shown in FIG. 2 are properly dealt with. When the two bits (D0, D1) of the first data is supplied to the internal circuit, it is sufficient in the case of FIG. 1 to have a latch that stores a single address corresponding to the two-bit data. In the case of FIG. 2, however, there is a need to have latches which store two addresses including a first address for the first two-bit data and a second address for second two-bit data. If only one latch is provided, the case of FIG. 2 cannot be handled. Namely, the address for the first two-bit data is rewritten by the address for the next data as the first two-bit data is transferred to the internal circuit, so that writing of data in specified memory cells cannot be achieved. Further, when the address latches are implemented via shift registers such as the address latches 61 and 62 of FIG. 12, such a configuration cannot cope with the case of FIG. 1. These shift registers perform a data-shift operation while holding a plurality of consecutive addresses (two addresses in this example). Because of this, an address cannot be output to the internal circuit for at least one clock cycle after the acquisition of the address. Namely, when the first two-bit data is transferred to the internal circuit, a corresponding address cannot be output from the shift register to the internal circuit.

The second embodiment is provided with two parallel sets of data latches (51, 52, 53; 54, 55, 56) (see FIG. 12). This configuration is necessary in order to cope with a case (FIG. 13) in which two sets of data must remain intact in the storage when the first two-bit data is transferred to the internal circuit and a case (FIG. 14) in which only one set of data needs to be kept in the storage.

In the examples of FIGS. 1 and 2 (or FIGS. 13 and 14), a description was given with respect to a case in which the margin of the time period tDSS is equivalent to one clock cycle.

Figure 23:
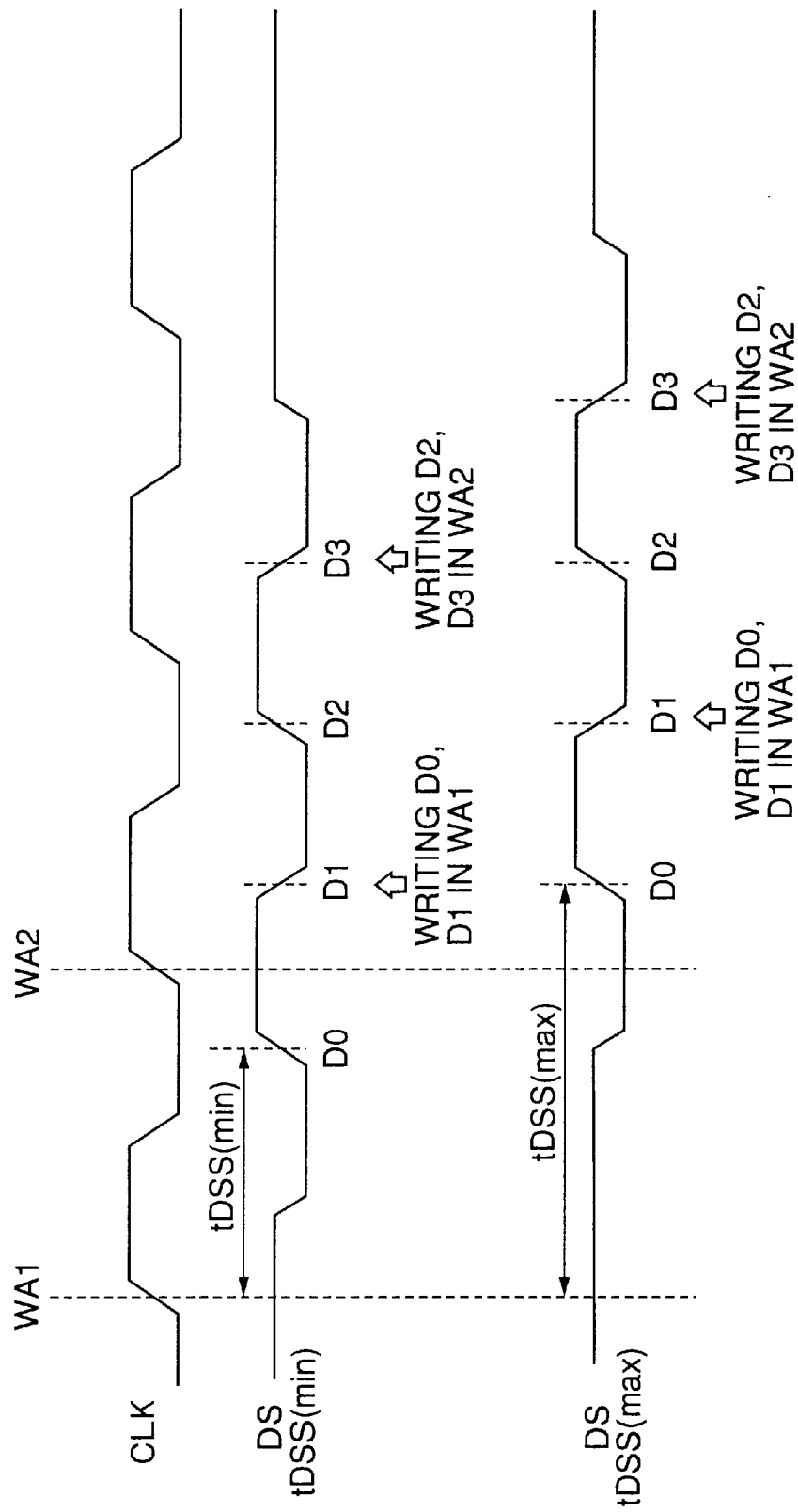
FIG. 23 is a timing chart for explaining timing relations between a clock signal, a data-strobe signal, and data-write timings when the time period tDSS has a relatively narrow margin.

FIG. 23 is a timing chart for explaining timing relations between the clock signal, the data-strobe signal, and the data-write timings when the time period tDSS has a narrower margin (e.g, equivalent to half the clock cycle).

As is shown in the example of FIG. 23, the address buffers must keep two addresses stored therein including an address for first two-bit data and an address for next two-bit data when the first two-bit data (D0, D1) is transferred to the internal circuit in parallel. In the example of FIG. 23, there is only one pattern of timing relations as to how the addresses are acquired. Because of this, a configuration based on the address latch 61 plus the shift register 62 as described in connection with FIG. 12 can be employed as an address-buffer configuration in place of the configuration using the latch 26 plus the latch 27 as shown in FIG. 3. It should be noted, however, that the shift register 62 of FIG. 12 delays an address signal by 1.5 clock cycles whereas the shift register in the third embodiment delays an address signal only by one clock cycle.

Figure 24:
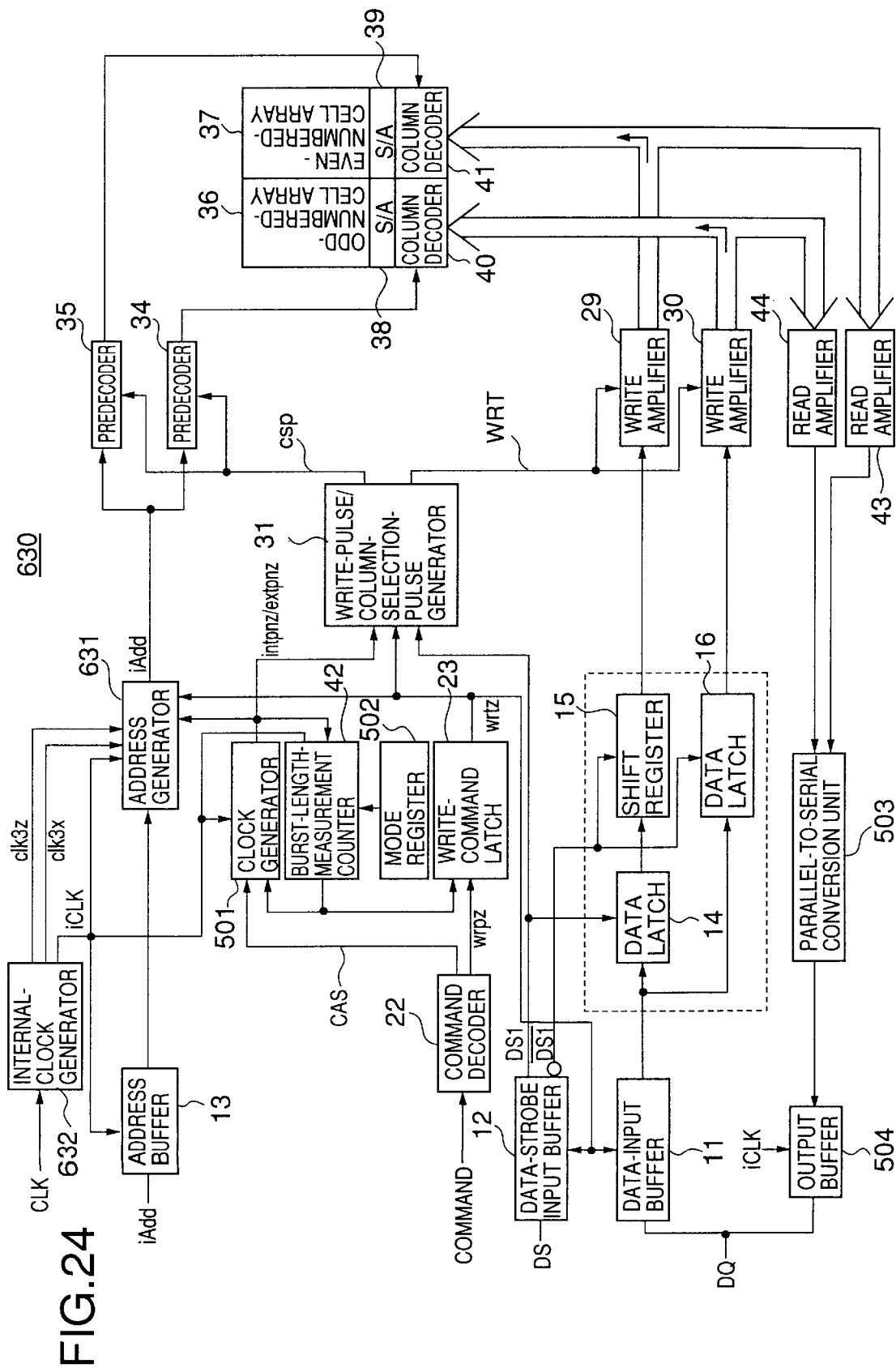
FIG. 24 is a block diagram of a third embodiment of the present invention.

FIG. 24 is a block diagram of the third embodiment of the present invention. In FIG. 24, the same elements as those of FIG. 3 are referred to by the sane numerals, and a description thereof will be omitted.

A semiconductor device 630 of FIG. 24 includes the data-input buffer 11, the data latch 14, the shift register 15, the data latch 16, the write amplifiers 29, 30, the odd-numbered-cell array 36, the even-numbered-cell array 37, the sense amplifiers 38, 39, the column decoders 40, 41, the read amplifiers 43, 44, the parallel-to-serial conversion unit 503, the output buffer 504, the data-strobe-input buffer 12, the command decoder 22, the write-command latch 23, the mode register 502, the burst-length-measurement counter 42, the clock generator 501, the write-pulse/column-selection-pulse generator 31, the address buffer 13, and the predecoders 34 and 35.

The semiconductor device of FIG. 24 does not includes the increment latch 24, the address generator 25, the latches 26, 27, the address buffer 28, the address generator 33, the internal-clock generator 21, the frequency dividers 17, 18, the latch-input-clock generator 20, and the latch-output-clock generator 19, all of which are shown in FIG. 3. Instead, the semiconductor device of FIG. 24 includes an internal-clock generator 632 and an address generator 631.

The internal-clock generator 632 has the same configuration as the internal-clock generator 60 of FIG. 12, and the address generator 631 has a configuration that combines the address latch 61, the shift register 62, the address generator 25, and the address buffer 28 of FIG. 12.

With regard to the write-pulse/column-selection-pulse generator of FIG. 24, the AND circuit 514 of FIG. 10 has one input thereof directly connected to the write-enable signal wrtz. Instead of this configuration, this input of the AND circuit 514 may be connected to the write-enable signal wrtz via such a one-clock delay as the one-clock delay 619 of FIG. 22. In the third embodiment, the first two-bit data D0 and D1 are not supplied to the internal circuit until at least one clock cycle after the inputting of the corresponding write command regardless of the time period tDSS. It is desirable, therefore, to provide a one-clock-delay circuit in order to insure that a write pulse/column-selection pulse is not generated by accident due to noise in the data-strobe signal DS or the like within one clock cycle from the inputting of the write command.

In this manner, the third embodiment has a simpler structure than the first embodiment.

Figure 25:
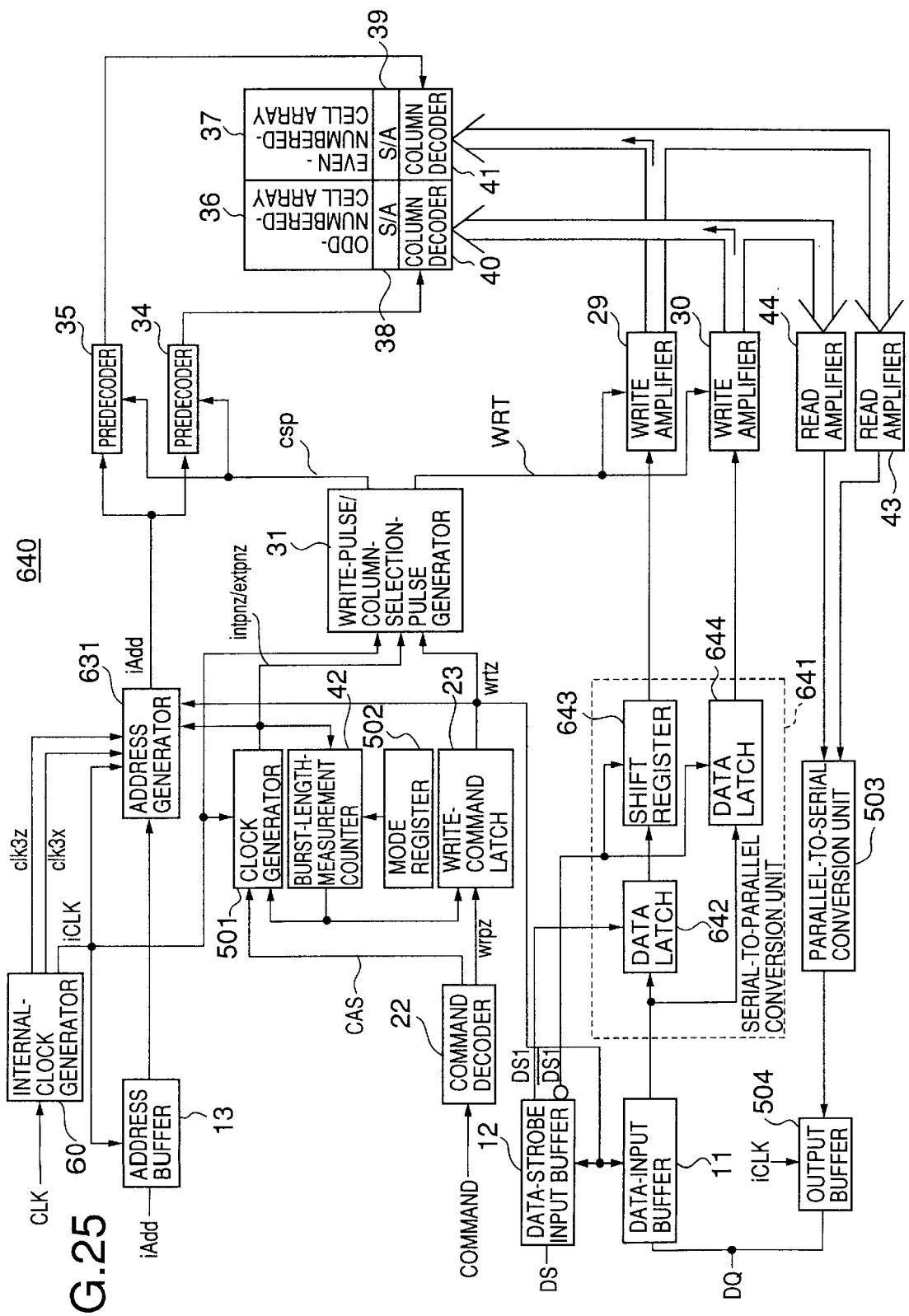
FIG. 25 is a block diagram of a fourth embodiment of the present invention.

FIG. 25 is a block diagram of the fourth embodiment of the present invention.

The second embodiment of FIG. 12 is provided with the two sets of data latches so as to satisfy such timing conditions as required in the case of FIG. 13 and the case of FIG. 14. When the tolerable margin of the time period tDSS is narrower than that of the second embodiment, there is a case in which it is sufficient for the data latches to hold only the first two-bit data at a moment when a corresponding address is output to the internal circuit 1.5 clock cycles after the acquisition of this address as shown in FIG. 14 regardless of where the actual time period tDSS is located within the tolerable margin. In such a case, one set of data latches (14, 15, 16) as in FIG. 3 may be used in place of the two sets of data latches (51, 52, 53; 54, 55, 56) as shown in FIG. 12.

In FIG. 25, the same elements as those of FIG. 12 are referred to by the same numerals, and a description thereof will be omitted.

A semiconductor device 640 of FIG. 25 includes the data-input buffer 11, the write amplifiers 29, 30, the odd-numbered-cell array 36, the even-numbered-cell array 37, the sense amplifiers 38, 39, the column decoders 40, 41, the read amplifiers 43, 44, the parallel-to-serial conversion unit 503, the output buffer 504, the data-strobe-input buffer 12, the command decoder 22, the write-command latch 23, the mode register 502, the burst-length-measurement counter 42, the clock generator 501, the write-pulse/column-selection-pulse generator 31, the address buffer 13, the predecoders 34, 35, and the internal-clock generator 60.

The semiconductor device 640 of FIG. 25 does not include the data latch 51, the shift register 52, the data latch 53, the data latch 54, the shift register 55, the data latch 56, the delay circuit 57, the frequency dividers 17, 18, the latch-input-clock generator 58, and the latch-output-clock generator 59, all of which are shown in FIG. 12. Instead, the semiconductor device 640 includes a serial-to-parallel conversion unit 641 comprised of a data latch 642, a shift register 643, and a data latch 644. The serial-to-parallel conversion unit 641 has the same configuration as the serial-to-parallel conversion unit 505 of the first embodiment shown in FIG. 3.

In this manner, the semiconductor memory device of the fourth embodiment has a simpler structure than does the second embodiment. In the fourth embodiment, just as in the second embodiment, addresses are acquired in synchronism with the clock signal, and data are acquired in synchronism with the data-strobe signal different from the clock signal, yet the internal circuit of the semiconductor device processes both the address and the data in synchronism with the clock signal.

Further, the present invention is not limited to these embodiments, but various variations and modifications may be made without departing from the scope of the present invention.

The present application is based on Japanese priority application No.10-022257 filed on Feb. 3, 1998, with Japanese Patent Office, the entire contents of which are hereby incorporated by reference.

What is claimed is:

1. A semiconductor device which receives addresses in synchronism with a clock signal and receives data in synchronism with a strobe signal, said semiconductor device comprising:

address-latch circuits which latches the addresses;

a first control circuit which selects one of said address-latch circuits in sequence in response to the clock signal, and controls the selected one of said address-latch circuits to latch a corresponding one of the addresses in response to the clock signal; and a second control circuit which selects one of said address-latch circuits in sequence in response to the strobe signal, and controls the selected one of said address-latch circuits to output a corresponding one of the addresses in response to the strobe signal.

2. The semiconductor device as claimed in claim 1, wherein said first control circuit includes a first frequency divider configured to divide a frequency of the clock signal, and selects one of said address-latch circuits in sequence by using the frequency-divided clock signal from said first frequency divider, and said second control circuit includes a second frequency divider configured to divide a frequency of the strobe signal, and selects one of said address-latch circuits in sequence by using the frequency-divided clock signal from said second frequency divider.

3. The semiconductor device as claimed in claim 1, further comprising:

an increment-latch circuit which latches one of the addresses in synchronism with the clock signal; and an address-generation circuit which increments the one of the addresses latched by said increment-latch circuit by 1, and supplies the incremented address to said address-latch circuits, wherein each of said address-latch circuits configured so as to be capable of selecting the corresponding one of the addresses externally provided or the incremented address supplied from said address-generation circuit for the latching operation thereof.

4. The semiconductor device as claimed in claim 1, further comprising an address buffer, wherein said address-latch circuits supply the addresses to said address buffer without a clock-cycle delay during a read operation.

5. The semiconductor device as claimed in claim 1, further comprising data-latch circuits, each of which latches a corresponding datum of the data in synchronism with the strobe signal, and outputs the corresponding datum of the data in synchronism with the strobe signal.

6. The semiconductor device as claimed in claim 5, wherein said data-latch circuits operate in response to a write-enable signal which is generated in response to a write command to said semiconductor device.

7. The semiconductor device as claimed in claim 6, wherein the write-enable signal controls said first control circuit and said second control circuit to operate for a predetermined time period after receiving the write command.

8. The semiconductor device as claimed in claim 5, wherein said data-latch circuit comprises:

a first data-latch circuit which latches a corresponding datum of the data in synchronism with a rising edge of the strobe signal; and a second data-latch circuit which latches a corresponding datum of the data in synchronism with a falling edge of the strobe signal.

9. A semiconductor device which receives addresses in synchronism with a clock signal and receives data in synchronism with a strobe signal, said semiconductor device comprising:

data-latch circuits;

a first control circuit which selects one of said data-latch circuits in sequence in response to the strobe signal, and controls the selected one of said data-latch circuits to latch a corresponding datum of the data in response to the strobe signal; and a second control circuit which selects one of said data-latch circuits in sequence in response to the clock signal, and controls the selected one of said data-latch circuits to output a corresponding datum of the data in response to the clock signal.

10. The semiconductor device as claimed in claim 9, wherein said first control circuit includes a first frequency divider configured to divide a frequency of the strobe signal, and selects one of said data-latch circuits in sequence by using the frequency-divided strobe signal from said first frequency divider, and said second control circuit includes a second frequency divider configured to divide a frequency of the clock signal, and selects one of said data-latch circuits in sequence by using the frequency-divided clock signal from said second frequency divider.

11. The semiconductor device as claimed in claim 9, wherein each of said data-latch circuits includes:
   a first latch which latches a corresponding datum of the data in synchronism with a rising edge of the strobe signal; and
   a second latch which latches a corresponding datum of the data in synchronism with a falling edge of the strobe signal.

12. The semiconductor device as claimed in claim 9, wherein said address-latch circuit operates in response to a write-enable signal which is generated in response to a write command to said semiconductor device.

13. The semiconductor device as claimed in claim 12, wherein the write-enable signal controls said first control circuit and said second control circuit to operate for a predetermined time period after receiving the write command.

14. The semiconductor device as claimed in claim 9, further comprising an address-latch circuit which latches the addresses in sequence in synchronism with the clock signal, and outputs the addresses in synchronism with the clock signal.

15. The semiconductor device as claimed in claim 14, further comprising
   an address-generation circuit which increments one of the addresses latched by said address-latch circuit, and supplies the incremented address to said address-latch circuit,
   wherein said address-latch circuit is configured so as to be capable of selecting the addresses externally provided or the incremented address supplied from said address-generation circuit for the latching operation thereof.

16. The semiconductor device as claimed in claim 14, wherein said address-latch circuit includes a delay circuit which delays output timings of the addresses by a predetermined number of cycles of the clock signal.

17. The semiconductor device as claimed in claim 14, further comprising an address buffer, wherein said address-latch circuit supplies the addresses to said address buffer without a clock-cycle delay during a read operation.

18. A memory circuit receiving a clock signal and a strobe signal which have an identical cycle but have independent timings, comprising:
   an address-input circuit which latches address signals in response to the clock signal, and outputs the address signals in response to a timing signal;
   a data-input circuit which latches data signals in response to the strobe signal, and outputs the data signals in response to said timing signal; and
   an internal circuit which writes the data signals supplied from the data-input circuit in memory cells indicated by the address signals supplied form the address-input circuit.

19. The memory circuit as claimed in claim 18, wherein said data-input circuit latches the data signals in synchronism with rising edges and falling edges of the strobe signal.

20. The memory circuit as claimed in claim 18, wherein said timing signal is responsive to the strobe signal.

21. The memory circuit as claimed in claim 20, wherein the address-input circuit includes:
   a first latch circuit which latches the address signal in response to a first rising edge of the clock signal, and outputs the address signal in response to the timing signal; and
   a second latch circuit, connected in parallel to the first latch circuit, which latches next address signal in response to a next rising edge of the clock signal, and outputs the next address signal in response to the timing signal.

22. The memory circuit as claimed in claim 21, wherein the address-input circuit outputs the address signal prior to outputting the next address signal.

23. The memory circuit as claimed in claim 20, wherein said address-input circuit includes a shift register which operates in response to the clock signal.

24. A method of writing data in the memory circuit of claim 23, comprising a step of adjusting an input timing of the strobe signal relative to the clock signal such that said shift register stores two addresses at a time when the data-input circuit outputs the data signals.

25. The memory circuit as claimed in claim 20, further comprising:
   a decode circuit which receives the address signal from the address-input circuit, and decodes the address signal in response to a first activation signal; and
   a write amplifier which receives the data signal from the data-input circuit, and amplifies the data signal in response to a second activation signal in a data-write mode,
   wherein both of the first and second activation signals are responsive to the strobe signal in the data-write mode.

26. The memory circuit as claimed in claim 25, wherein in a data-read mode, the first activation signal is responsive to the clock signal, and the second activation signal is in a deactivated state.

27. The memory circuit as claimed in claim 25, wherein in the data-write mode, the first activation signal activates said decode circuit after said address-input circuit outputs the address signals, and the second activation signal activates said write amplifier after said data-input circuit outputs the data signals.

28. The memory circuit as claimed in claim 18, wherein said timing signal is responsive to the clock signal.

29. The memory circuit as claimed in claim 28, wherein said data-input circuit includes:
   a first data-input circuit which latches the data signals in sequence in response to a first rising edge and a first falling edge of the strobe signal, and outputs the data signals in parallel in response to the timing signal; and
   a second data-input circuit, connected in parallel to the first data-input circuit, which latches next data signals in sequence in response to a next rising edge and a next falling edge of the strobe signal, and outputs the next data signals in parallel in response to the timing signal.

30. The memory circuit as claimed in claim 29, wherein said data-input circuit outputs the data signals prior to outputting the next data signals.

31. The memory circuit as claimed in claim 28, wherein said data-input circuit includes a first data-input circuit which latches the data signals in sequence in response to a rising edge and a falling edge of the strobe signal, and outputs the data signals in parallel in response to the timing signal.

32. The memory circuit as claimed in claim 31, wherein said first data-input circuit latches next data signals after outputting the data signals.

33. The memory circuit as claimed in claim 28, wherein said address-input circuit includes a shift register which operates in response to the clock signal.

34. The memory circuit as claimed in claim 33, wherein said shift register delays the address signals by 1.5 clock cycles of the clock signal.

35. The memory circuit as claimed in claim 28, further comprising:
- a decode circuit which receives the address signal from the address-input circuit, and decodes the address signal in response to a first activation signal; and
- a write amplifier which receives the data signal from the data-input circuit, and amplifies the data signal in response to a second activation signal in a data-write mode,
- wherein both of the first and second activation signals are responsive to the clock signal in the data-write mode.

36. The memory circuit as claimed in claim 39, wherein in a data-read mode, the first activation signal is responsive to the clock signal, and the second activation signal is in a deactivated state.

37. The memory circuit as claimed in claim 35, wherein in the data-write mode, the first activation signal activates said decode circuit after said address-input circuit outputs the address signals, and the second activation signal activates said write amplifier after said data-input circuit outputs the data signals.

38. The memory circuit as claimed in claim 18, wherein a timing at which said address-input circuit outputs the address signals is concurrent with a timing at which said data-input circuit outputs the data signals corresponding to the address signals.

39. A memory circuit, comprising:
- an address-input circuit which latches address signals in response to a clock signal, and outputs the address signals in response to a timing signal;
- a data-input circuit which latches data signals in response to a strobe signal, and outputs the data signals in response to the timing signal;
- an internal circuit which writes the data signals supplied from the data-input circuit in memory cells indicated by the address signals supplied from the address-input circuit; and
- the strobe signal has a cycle identical to that of the clock signal, and a first timing of a first rising edge of the strobe signal is different from a second timing of a corresponding rising edge of the clock signal.

40. The memory circuit as claimed in claim 39, wherein the first timing is later than the second timing with a timing gap therebetween being shorter than one cycle of the clock signal.

41. A memory circuit, comprising:
- an address-input circuit which latches address signals in response to a clock signal, and outputs the address signals in response to a timing signal, said address-input circuit includes a shift register which operates in response to the clock signal;
- a data-input circuit which latches data signals in response to a strobe signal, and outputs the data signals in response to the timing signal;
- an internal circuit which writes the data signals supplied from the data-input circuit in memory cells indicated by the address signals supplied from the address-input circuit;
- said timing signal is responsive to the clock signal; and
- a bypass circuit provided in parallel to said shift register, wherein the address signals pass through the bypass circuit and bypass said shift register in a data-read mode.

42. A memory circuit, comprising:
- an address-input circuit which latches address signals in response to a clock signal, and outputs the address signals in response to a timing signal, the address-input circuit includes a shift register which operates in response to the clock signal;
- a data-input circuit which latches data signals in response to a strobe signal, and outputs the data signals in response to the timing signal;
- an internal circuit which writes the data signals supplied from the data-input circuit in memory cells indicated by the address signals supplied from the address-input circuit;
- the said timing signal is responsive to the strobe signal; and
- a bypass circuit provided in parallel to said shift register, wherein the address signals pass through the bypass circuit and bypass said shift register in a data-read mode.

* * * * *

(12) EX PARTE REEXAMINATION CERTIFICATE (7221st)
United States Patent
Tomita et al.

(10) Number: US 6,292,428 C1
(45) Certificate Issued: Dec. 8, 2009

(54) SEMICONDUCTOR DEVICE RECONCILING DIFFERENT TIMING SIGNALS

(75) Inventors: Hiroyoshi Tomita, Kawasaki (JP); Tatsuya Kanda, Kawasaki (JP)

(73) Assignee: Fujitsu Limited, Nakahara-Ku, Kawasaki-Shi, Kanagawa (JP)

Reexamination Request:
No. 90/008,666, Jul. 20, 2007

Reexamination Certificate for:
Patent No.: 6,292,428
Issued: Sep. 18, 2001
Appl. No.: 09/240,007
Filed: Jan. 29, 1999

(51) Int. Cl.
*G11C 8/00* (2006.01)
*G11C 8/04* (2006.01)
*G11C 8/18* (2006.01)
*G11C 7/10* (2006.01)

(52) U.S. Cl. .............. 365/233.1; 365/189.05; 365/230.08; 365/189.12; 365/193; 365/233.16; 365/233.17

(58) Field of Classification Search ............ None
See application file for complete search history.

(56) References Cited

U.S. PATENT DOCUMENTS

| 5,479,370 A | 12/1995 | Furuyama et al. |
|---|---|---|
| 5,515,325 A | 5/1996 | Wada |
| 5,568,445 A | 10/1996 | Park et al. |
| 5,748,558 A | 5/1998 | Suzuki |
| 5,748,588 A | 5/1998 | Maeda et al. |
| 5,761,150 A | 6/1998 | Yukutake |
| 5,793,680 A | 8/1998 | Okajima |
| 5,838,631 A | 11/1998 | Mick |
| 5,896,347 A | 4/1999 | Tomita et al. |
| 6,034,916 A | 3/2000 | Lee |
| 6,078,546 A | 6/2000 | Lee |
| 6,178,139 B1 | 1/2001 | Hirobe et al. |
| 6,546,476 B1 | 4/2003 | Gillingham |

FOREIGN PATENT DOCUMENTS

| JP | 59-148191 A | 8/1984 |
|---|---|---|
| JP | 61-162886 | 7/1986 |
| JP | 5-182453 A | 7/1993 |
| JP | H8-45277 | 2/1996 |
| JP | H8-321180 | 12/1996 |

OTHER PUBLICATIONS

Jei Hwan Yoo et al., IEEE J. of Solid–State Circuits, vol. 31, No. 11, Nov. 1996, pp. 1635–1643.
Technical Report of IBICE., Oct. 1998, pp. 1–6.
IEEE J. of Solid–State Circuits, vol. 32, No. 11, Nov. 1997, pp. 1758–1765.

*Primary Examiner*—Tuan H Nguyen

(57) ABSTRACT

A semiconductor device which receives addresses in synchronism with a clock signal and receives data in synchronism with a strobe signal includes address-latch circuits, a first control circuit which selects one of the address-latch circuits in sequence in response to the clock signal, and controls the selected one of the address-latch circuits to latch a corresponding one of the addresses in response to the clock signal, and a second control circuit which selects one of the address-latch circuits in sequence in response to the strobe signal, and controls the selected one of the address-latch circuits to output a corresponding one of the addresses in response to the strobe signal.

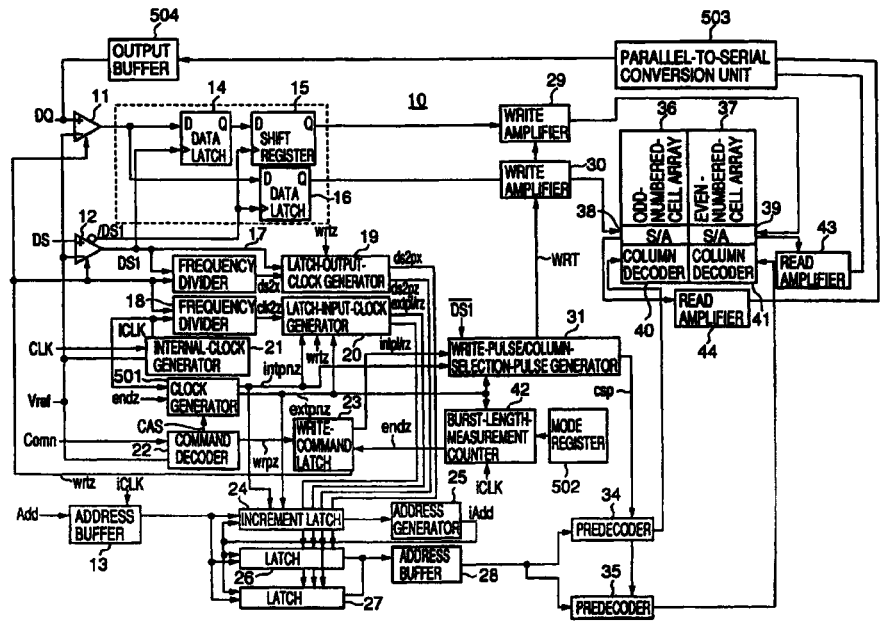

EX PARTE
REEXAMINATION CERTIFICATE
ISSUED UNDER 35 U.S.C. 307

THE PATENT IS HEREBY AMENDED AS
INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 9–17 are cancelled.

Claims 18–21, 23–26, 28, 29 and 31, 33–36, 39–42 are determined to be patentable as amended.

Claims 22, 27, 30, 32, 37 and 38 dependent on an amended claim, are determined to be patentable.

New claims 43–62 are added and determined to be patentable.

Claims 1–8 were not reexamined.

18. A memory circuit receiving [a] *an external* clock signal and a *data* strobe signal which have an identical cycle but have independent *rising* timings, comprising:
  an address-input circuit which latches address signals in response to the *external* clock signal, and outputs the address signals in response to a timing signal;
  a data-input circuit which latches data signals in response to the *data* strobe signal, and outputs the data signals in response to said timing signal; and
  an internal circuit which writes the data signals supplied from the data-input circuit in memory cells indicated by the address signals supplied form the address-input circuit.

19. The memory circuit as claimed in claim 18, wherein said data-input circuit latches the data signals in synchronism with rising edges and falling edges of the *data* strobe signal.

20. The memory circuit as claimed in claim 18, wherein said timing signal is responsive to the *data* strobe signal.

21. The memory circuit as claimed in claim 20, wherein the address-input circuit includes:
  a first latch circuit which latches the address [signal] *signals* in response to a first rising edge of the *external* clock signal, and outputs the address [signal] *signals* in response to the timing signal; and
  a second latch circuit, connected in parallel to the first latch circuit, which latches next address [signal] *signals* in response to a next rising edge of the *external* clock signal, and outputs the next address [signal] *signals* in response to the timing signal.

23. The memory circuit as claimed in claim 20, wherein said address-input circuit includes a shift register which operates in response to the *external* clock signal.

24. A method of writing data in the memory circuit of claim 23, comprising a step of adjusting an input timing of the *data* strobe signal relative to the *external* clock signal such that said shift register stores two [addresses] *address signals* at a time when the data-input circuit outputs the data signals.

25. The memory circuit as claimed in claim 20, further comprising:
  a decode circuit which receives the address [signal] *signals* from the address-input circuit, and decodes the address [signal] *signals* in response to a first activation signal; and
  a write amplifier which receives the data [signal] *signals* from the data-input circuit, and amplifies the data [signal] *signals* in response to a second activation signal in a data-write mode,
  wherein both of the first and second activation signals are responsive to the *data* strobe signal in the data-write mode.

26. The memory circuit as claimed in claim 25, wherein in a data-read mode, the first activation signal is responsive to the *external* clock signal, and the second activation signal is in a deactivated state.

28. The memory circuit as claimed in claim 18, wherein said timing signal is responsive to the *external* clock signal.

29. The memory circuit as claimed in claim 28, wherein said data-input circuit includes:
  a first data-input circuit which latches the data signals in sequence in response to a first rising edge and a first falling edge of the *data* strobe signal, and outputs the data signals in parallel in response to the timing signal; and
  a second data-input circuit, connected in parallel to the first data-input circuit, which latches next data signals in sequence in response to a next rising edge and a next falling edge of the *data* strobe signal, and outputs the next data signals in parallel in response to the timing signal.

31. The memory circuit as claimed in claim 28, wherein said data-input circuit includes a first data-input circuit which latches the data signals in sequence in response to a rising edge and a falling edge of the *data* strobe signal, and outputs the data signals in parallel in response to the timing signal.

33. The memory circuit as claimed in claim 28, wherein said address-input circuit includes a shift register which operates in response to the *external* clock signal.

34. The memory circuit as claimed in claim 33, wherein said shift register delays the address signals by 1.5 clock cycles of the *external* clock signal.

35. The memory circuit as claimed in claim 28, further comprising:
  a decode circuit which receives the address [signal] *signals* from the address-input circuit, and decodes the address [signal] *signals* in response to a first activation signal; and
  a write amplifier which receives the data [signal] *signals* from the data-input circuit, and amplifies the data [signal] *signals* in response to a second activation signal in a data-write mode,
  wherein both of the first and second activation signals are responsive to the *external* clock signal in the data-write mode.

36. The memory circuit as claimed in claim [39] *35*, wherein in a data-read mode, the first activation signal is responsive to the *external* clock signal, and the second activation signal is in a deactivated state.

39. A memory circuit, comprising:
  an address-input circuit which latches address signals in response to [a] *an external* clock signal, and outputs the address signals in response to a timing signal;
  a data-input circuit which latches data signals in response to a *data* strobe signal, and outputs the data signals in response to the timing signal; *and* an internal circuit which writes the data signals supplied from the data-input circuit in memory cells indicated by the address signals supplied from the address-input circuit; [and]

wherein the *data* strobe signal has a cycle identical to that of the *external* clock signal, and a first timing of a first rising edge of the *data* strobe signal is different from a second timing of a corresponding rising edge of the *external* clock signal.

40. The memory circuit as claimed in claim 39, wherein the first timing is later than the second timing with a timing gap therebetween being shorter than one cycle of the *external* clock signal.

41. A memory circuit, comprising:

an address-input circuit which latches address signals in response to [a] *an external* clock signal, and outputs the address signals in response to a timing signal, said address-input circuit includes a shift register, which operates in response to the *external* clock signal, *for delaying the address signals*;

a data-input circuit which latches data signals in response to a *data* strobe signal, and outputs the data signals in response to the timing signal;

an internal circuit which writes the data signals supplied from the data-input circuit in memory cells indicated by the address signals supplied from the address-input circuit;

said timing signal [is] *being* responsive to the *external* clock signal; and a bypass circuit provided in parallel to said shift register, wherein the address signals pass through the bypass circuit and bypass said shift register in a data-read mode.

42. A memory circuit, comprising:

an address-input circuit which latches address signals in response to [a] *an external* clock signal, and outputs the address signals in response to a timing signal, the address-input circuit includes a shift register, which operates in response to the *external* clock signal, *for delaying the address signals*;

a data-input circuit which latches data signals in response to a *data* strobe signal, and outputs the data signals in response to the timing signal;

an internal circuit which writes the data signals supplied from the data-input circuit in memory cells indicated by the address signals supplied from the address-input circuit;

[the] *said* timing signal [is] *being* responsive to the *data* strobe signal; and a bypass circuit provided in parallel to said shift register, wherein the address signals pass through the bypass circuit and bypass said shift register in a data-read mode.

43. The memory circuit as claimed in claim 41, wherein the memory circuit receives the data strobe signal associated with the data signals that has the same cycle but has a different rising timing in comparison with the external clock signal.

44. The memory circuit as claimed in claim 41, wherein the internal circuit writes the data signals in the memory cells indicated by the address signals to perform a data write operation.

45. The memory circuit as claimed in claim 41, wherein the memory cells are DRAM memory cells.

46. The memory circuit as claimed in claim 45, wherein the memory circuit is a DDR SDRAM in which the data-input circuit latches the data signals in response to a rising edge and a falling edge of the data strobe signal.

47. The memory circuit as claimed in claim 46, wherein the address-input circuit latches the address signals in synchronism with the external clock signal, and the data-input circuit latches the data signals in synchronism with the data strobe signal.

48. The memory circuit as claimed in claim 41, further comprising:

a command decoder decoding external control signals to output a write signal in a data-write mode;

a data input buffer enabled in response to the write signal and receiving external data signals to transmit the data signals to the data-input circuit, and a data strobe input buffer enabled in response to the write signal and receiving the data strobe signal to transmit the data strobe signal to the data-input circuit.

49. The memory circuit as claimed in claim 46, wherein the data-input circuit includes a serial-to-parallel conversion circuit which comprises a first data latch for latching the data signals in response to the rising edge of the data strobe signal; and a second data latch for latching the data signals in response to the falling edge of the data strobe signal; and wherein the serial-to-parallel conversion circuit outputs the data signals in parallel from the first and second data latches to the internal circuit in response to the external clock signal.

50. The memory circuit as claimed in claim 46, wherein the address signals are column addresses.

51. The memory circuit as claimed in claim 46, wherein the rising edge of the data strobe signal has a different timing from that of the external clock signal with a tolerable timing margin.

52. The memory circuit as claimed in claim 51, wherein the tolerable timing margin is half clock cycles.

53. The memory circuit as claimed in claim 46, wherein the data-input circuit latches the data signals one clock cycle after the address-input circuit latches the address signals.

54. The memory circuit as claimed in claim 46, wherein the shift-register produces a delay of fixed clock cycles for the address signals.

55. The memory circuit as claimed in claim 54, wherein the delay is multiples of half clock cycles.

56. The memory circuit as claimed in claim 55, wherein the delay is 1.5 clock cycles.

57. The memory circuit as claimed in claim 54, wherein the internal circuit starts writing the data signals in the DRAM memory cells upon an end of the delay.

58. The memory circuit as claimed in claim 46, wherein the shift-register comprises a plurality of latch circuits connected in series.

59. The memory circuit as claimed in claim 46, wherein the address signals do not pass through the shift-register in the data-read mode.

60. The memory circuit as claimed in claim 46, wherein the bypass circuit includes a transfer gate, and the address signals pass through the transfer gate in the data-read mode.

61. The memory circuit as claimed in claim 41, further comprising:

a command decoder decoding external control signals to output a write signal in a data-write mode;

*a latch output clock generator operating responsive to the write signal and the external clock signal for delaying the write signal as a function of a clock cycle to output an output clock for the data-input circuit to output the data signals.*

62. *The memory circuit as claimed in claim 61, further comprising:*

*a mode register storing a burst length, and*

*a counter counting a clock pulse according to the burst length and resetting the write signal upon an end of counting.*

\* \* \* \* \*